United States Patent
Steinmann et al.

(10) Patent No.: US 11,721,755 B2
(45) Date of Patent: Aug. 8, 2023

(54) METHODS OF FORMING SEMICONDUCTOR POWER DEVICES HAVING GRADED LATERAL DOPING

(71) Applicant: Wolfspeed, Inc., Durham, NC (US)

(72) Inventors: Philipp Steinmann, Durham, NC (US); Edward Van Brunt, Raleigh, NC (US); Jae Hyung Park, Apex, NC (US); Vaishno Dasika, Morrisville, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/669,409

(22) Filed: Feb. 11, 2022

(65) Prior Publication Data

US 2022/0165876 A1    May 26, 2022

Related U.S. Application Data

(63) Continuation of application No. 16/892,604, filed on Jun. 4, 2020, now Pat. No. 11,282,951.

(51) Int. Cl.
  *H01L 29/78* (2006.01)
  *H01L 29/16* (2006.01)
(52) U.S. Cl.
  CPC ...... *H01L 29/7802* (2013.01); *H01L 29/1608* (2013.01); *H01L 29/7833* (2013.01)
(58) Field of Classification Search
  CPC ............. H01L 29/7802; H01L 29/1608; H01L 29/7883
  See application file for complete search history.

(56) References Cited

U.S. PATENT DOCUMENTS

| | | |
|---|---|---|
| 2006/0102908 A1 | 5/2006 | Imai et al. |
| 2009/0078942 A1 | 3/2009 | Kono et al. |
| 2014/0061675 A1 | 3/2014 | Watanabe et al. |
| 2016/0099316 A1* | 4/2016 | Arai ............. H01L 29/7813 257/77 |
| 2016/0163817 A1 | 6/2016 | Horii et al. |
| 2017/0077285 A1 | 3/2017 | Uehara et al. |
| 2017/0229535 A1* | 8/2017 | Hatta ............ H01L 29/7806 |
| 2017/0229541 A1 | 8/2017 | Nakamura et al. |
| 2021/0134997 A1* | 5/2021 | Cho ............. H01L 29/1095 |

FOREIGN PATENT DOCUMENTS

| | | |
|---|---|---|
| JP | 2006066439 A | 3/2006 |
| JP | 2009064970 A | 3/2009 |

OTHER PUBLICATIONS

PCT Notification of Transmittal of the International Search Report and the Written Opinion of the International Searching Authority, or the Declaration, dated Jul. 20, 2021, for corresponding PCT International Application No. PCT/US2021/027259.
"International Preliminary Report on Patentability for International Patent Application No. PCTUS21027259, dated Dec. 15, 2022, 12 pages".

* cited by examiner

*Primary Examiner* — Michael Jung
(74) *Attorney, Agent, or Firm* — Myers Bigel, P.A.

(57) ABSTRACT

A semiconductor device includes a semiconductor layer structure comprising a source/drain region, a gate dielectric layer on the semiconductor layer structure, and a gate electrode on the gate dielectric layer. The source/drain region comprises a first portion comprising a first dopant concentration and a second portion comprising a second dopant concentration. The second portion is closer to a center of the gate electrode than the first portion.

26 Claims, 12 Drawing Sheets

METHODS OF FORMING SEMICONDUCTOR POWER DEVICES HAVING GRADED LATERAL DOPING

CROSS REFERENCE TO RELATED APPLICATION

The present application is a continuation of and claims priority under 35 U.S.C. § 120 to U.S. patent application Ser. No. 16/892,604, filed Jun. 4, 2020, the entire content of which is incorporated herein by reference.

FIELD

The present invention relates to semiconductor devices and, more particularly, to power semiconductor switching devices.

BACKGROUND

The Metal Insulating Semiconductor Field Effect Transistor ("MISFET") is a well-known type of semiconductor transistor that may be used as a switching device. A MISFET is a three terminal device that has gate, drain and source terminals, and a semiconductor body. A source region and a drain region are formed in the semiconductor body that are separated by a channel region, and a gate electrode (which may act as the gate terminal or be electrically connected to the gate terminal) is disposed adjacent the channel region. A MISFET may be turned on or off by applying a bias voltage to the gate electrode. When a MISFET is turned on (i.e., it is in its "on-state"), current is conducted through the channel region of the MISFET between the source region and drain regions. When the bias voltage is removed from the gate electrode (or reduced below a threshold level), the current ceases to conduct through the channel region. By way of example, an n-type MISFET has n-type source and drain regions and a p-type channel. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

The gate electrode of a power MISFET is typically separated from the channel region by a thin gate dielectric layer. In most cases, the gate dielectric layer is an oxide layer (e.g., a silicon oxide layer). A MISFET that has an oxide gate dielectric layer is referred to as a Metal Oxide Semiconductor Field Effect Transistor ("MOSFET"). As oxide gate dielectric layers are frequently used due to their superior properties, the discussion herein will focus on MOSFETs as opposed to MISFETs, but it will be appreciated that the techniques according to embodiments of the present invention that are described herein are equally applicable to devices having gate dielectric layers formed with materials other than oxides.

Because the gate electrode of the MOSFET is insulated from the channel region by the gate dielectric layer, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

There is an increasing demand for high power semiconductor switching devices that can pass large currents in their "on" state and block large voltages (e.g., thousands of volts) in their reverse blocking state. In order to support high current densities and block such high voltages, power MOSFETs and IGBTs typically have a vertical structure with the source and drain on opposite sides of a thick semiconductor layer structure in order to block higher voltage levels. In very high power applications, the semiconductor switching devices are typically formed in wide band-gap semiconductor material systems (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high melting point, and high-saturated electron drift velocity. Relative to devices formed using other semiconductor materials such as, for example, silicon, electronic devices formed using silicon carbide may have the capability of operating at higher temperatures, at high power densities, at higher speeds, at higher power levels, and/or under high radiation densities.

One failure mechanism for a power MOSFET is so-called "breakdown" of the gate dielectric layer. Under an increased reverse bias during a blocking operation of the power MOSFET, high electric fields applied to the gate dielectric layer may cause a leakage current to flow in the device. This leakage current may occur at lower reverse bias values when the gate dielectric (e.g., the gate oxide) is of lower quality. For example, a lower quality dielectric may have weakened and/or broken bonds within the material of the gate dielectric that can form traps for electrical charges. Such traps can contribute to the leakage current during a reverse bias, which can cause the power MOSFET to fail prematurely.

SUMMARY

Pursuant to embodiments of the present invention, a semiconductor device, includes: a semiconductor layer structure comprising a source/drain region; a gate dielectric layer n the semiconductor layer structure; and a gate electrode on the gate dielectric layer. The source/drain region includes a first portion comprising a first dopant concentration and a second portion comprising a second dopant concentration, the second dopant concentration is lower than the first dopant concentration, and the second portion is closer to a center of the gate electrode than the first portion.

In some embodiments, the gate electrode extends on the second portion of the source/drain region.

In some embodiments, a side boundary of the first portion of the source/drain region is laterally offset from a side boundary of the second portion of the source/drain region by a distance of between 50 Å to 2000 Å.

In some embodiments, the first dopant concentration of the first portion is between one to three orders of magnitude greater than the second dopant concentration of the second portion.

In some embodiments, the semiconductor device further includes an interface between the first portion and the second portion of the source/drain region.

In some embodiments, an edge of the gate electrode is laterally separated from the interface between the first portion and the second portion of the source/drain region by 1000 Å to 5000 Å.

In some embodiments, a first bottom surface of the first portion of the source/drain region is at a different level than a second bottom surface of the second portion of the source/drain region.

In some embodiments, a thickness of the gate dielectric layer over the second portion of the source/drain region is substantially uniform.

In some embodiments, the semiconductor layer structure comprises a substrate comprising silicon carbide.

Pursuant to embodiments of the present invention, a semiconductor device includes a semiconductor layer structure comprising a drift layer of a first conductivity type; a well region of a second conductivity type in the drift layer; and a source/drain region of the first conductivity type in the well region, the source/drain region having a first doping concentration in a first portion of the source/drain region and a second doping concentration, different from the first doping concentration, in a second portion of the source/drain region that is laterally offset from the first portion.

In some embodiments, the semiconductor layer structure further comprises a substrate comprising silicon carbide.

In some embodiments, a first dopant concentration of the first portion is between one to three orders of magnitude greater than a second dopant concentration of the second portion.

In some embodiments, the second portion of the source/drain region is between the first portion of the source/drain region and the well region.

In some embodiments, a first bottom surface of the first portion of the source/drain region is at a different level than a second bottom surface of the second portion of the source/drain region.

In some embodiments, the semiconductor device further includes a gate dielectric layer on the semiconductor layer structure and a gate electrode on the gate dielectric layer.

In some embodiments, the gate electrode overlaps the second portion of the source/drain region and not the first portion of the source/drain region.

In some embodiments, a thickness of the gate dielectric layer over the second portion of the source/drain region is substantially uniform.

Pursuant to embodiments of the present invention, a method of forming a semiconductor device, includes providing a drift layer on a substrate; an ion implantation of a first portion of a source/drain region in the drift layer at a first dopant dose; and an ion implantation of a second portion of the source/drain region in the first portion of the source/drain region at a second dopant dose, different from the first dopant dose.

In some embodiments, the first dopant dose is between $1 \times 10^{12}$ dopants/cm$^2$ to $1 \times 10^{15}$ dopants/cm$^2$.

In some embodiments, the second dopant dose is between $5 \times 10^{14}$ dopants/cm$^2$ to $5 \times 10^{16}$ dopants/cm$^2$.

In some embodiments, the method further includes, prior to the ion implantation of the first portion of the source/drain region, an ion implantation in the drift layer of a well region having a conductivity type opposite that of the source/drain region.

In some embodiments, wherein the ion implantation of the well region is performed at a third dopant dose of between $1 \times 10^{12}$ dopants/cm$^2$ to $1 \times 10^{14}$ dopants/cm$^2$.

In some embodiments, a side boundary of the first portion of the source/drain region is laterally offset from a side boundary of the second portion of the source/drain region by a distance of between 50 Å to 2000 Å.

In some embodiments, the method further includes forming a gate dielectric layer on the drift layer; and forming a gate electrode on the gate dielectric layer.

In some embodiments, an edge of the gate electrode is laterally separated from an interface between the first portion and the second portion of the source/drain region by 1000 Å to 5000 Å.

In some embodiments, a thickness of the gate dielectric layer over the first portion of the source/drain region is substantially uniform.

In some embodiments, forming the gate dielectric layer comprises thermally growing the gate dielectric layer.

In some embodiments, the gate dielectric layer comprises silicon dioxide.

In some embodiments, the ion implantation of the first portion of the source/drain region comprises depositing a mask layer on the drift layer; and patterning and etching the mask layer.

In some embodiments, patterning and etching the mask layer comprises leaving a first portion of the mask layer present on the drift layer, and the ion implantation of the first portion of the source/drain region further comprises implanting ions through the first portion of the mask layer.

In some embodiments, the first portion of the mask layer has a thickness between 50 Å to 500 Å.

Pursuant to embodiments of the present invention, a semiconductor device includes a semiconductor layer structure comprising a source/drain region; a gate dielectric layer on the semiconductor layer structure; and a gate electrode on the gate dielectric layer. The source/drain region comprises a first portion comprising a first dopant concentration and a second portion comprising a second dopant concentration, and an edge of the gate electrode is laterally separated from an interface between the first portion and the second portion of the source/drain region by 5000 Å or less.

In some embodiments, the gate electrode overlaps the second portion of the source/drain region.

In some embodiments, a first dopant concentration of the first portion is between one to three orders of magnitude greater than a second dopant concentration of the second portion.

In some embodiments, a thickness of the gate dielectric layer over the second portion of the source/drain region is substantially uniform.

In some embodiments, the semiconductor layer structure further comprises a well region of a second conductivity type, and the second portion of the source/drain region is between the first portion of the source/drain region and the well region.

Pursuant to embodiments of the present invention, a semiconductor device includes a silicon carbide (SiC) semiconductor layer structure comprising a source/drain region, a channel region, and a drift layer; a gate dielectric layer on the SiC semiconductor layer structure; and a gate electrode on the gate dielectric layer. A first portion of the gate dielectric layer that is on the gate electrode and the source/drain region has a first thickness, a second portion of the gate dielectric layer that is on the gate electrode and the channel region of the SiC semiconductor layer structure has a second thickness, and the first thickness is within 15% of the second thickness.

In some embodiments, a first concentration of semiconductor lattice damage induced defects in the first portion of the gate dielectric layer is within 10% of a second concentration of semiconductor lattice damage induced defects in the second portion of the gate dielectric layer.

In some embodiments, the gate dielectric layer further comprises a third portion, different from the second portion, that is on the gate electrode and the source/drain region, and a third thickness of the third portion is greater than the first thickness of the first portion.

In some embodiments, the source/drain region is a first source/drain region, the semiconductor layer structure further comprises a second source/drain region, with the drift layer extending in a first direction between the first and second source/drain regions, and a width of the first portion of the gate dielectric layer in the first direction is greater than a width of the third portion of the gate dielectric layer in the first direction.

In some embodiments, a third concentration of semiconductor lattice damage induced defects in the third portion of the gate dielectric layer varies by greater than 10% from the second concentration of semiconductor lattice damage induced defects in the second portion of the gate dielectric layer.

In some embodiments, the source/drain region comprises a high-concentration region comprising a first dopant concentration and a low-concentration region comprising a second dopant concentration, the first dopant concentration being higher than the second dopant concentration.

In some embodiments, an edge of the gate electrode is laterally separated from an interface between the high-concentration region and the low-concentration region of the source/drain region by 5000 Å or less.

In some embodiments, the first portion of the gate dielectric layer is on the low-concentration region of the source/drain region.

DETAILED DESCRIPTION

Figure 1A:
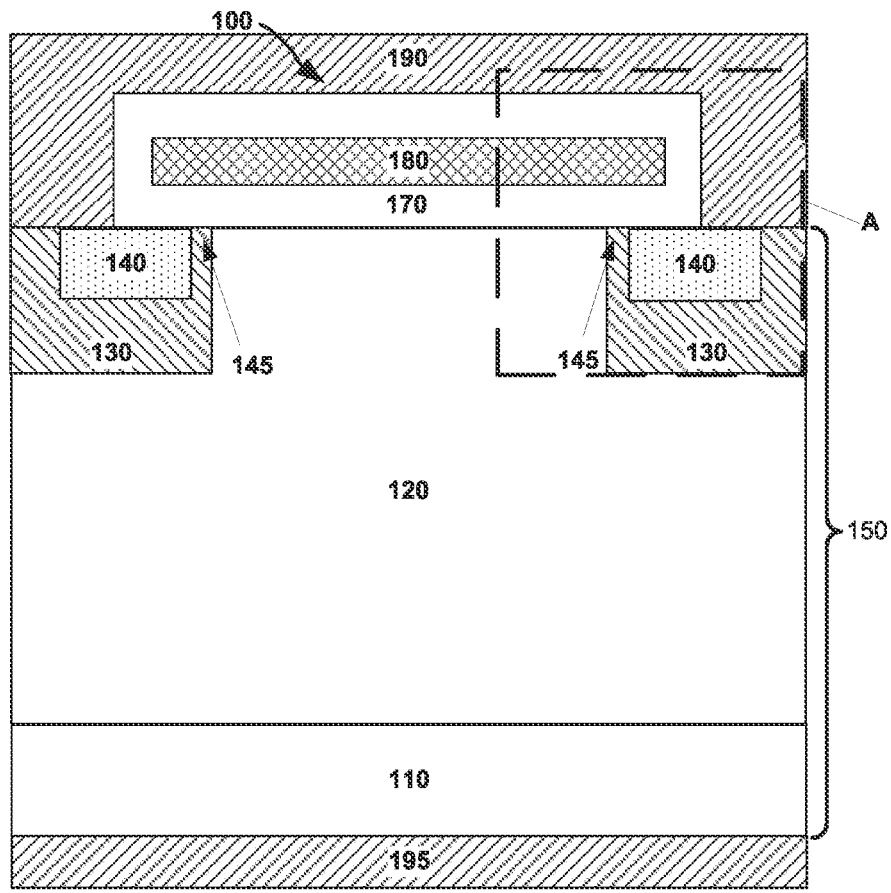
FIG. 1A is a schematic cross-sectional diagram of a unit cell of a conventional semiconductor device, with areas of concern identified according to some embodiments described herein.

Power silicon carbide based MOSFETs are in use today for applications requiring high voltage blocking. By way of example, silicon carbide MOSFETs are commercially available that are rated for current densities of 300 A/cm$^2$ or more that will block voltages above 600V. To form such devices, a plurality of "unit cells" are typically formed, where each unit cell includes a MOSFET transistor. In high power applications, a large number of these unit cells (e.g., hundreds or thousands) are typically provided on a semiconductor substrate, and a gate electrode layer is formed on a top side of the semiconductor substrate that acts as the gate electrode for all of the unit cells. The opposite (bottom) side of the semiconductor substrate acts as a common drain for all of the units cells of the device. A plurality of source contacts are formed on source regions in the semiconductor layer structure that are exposed within openings in the gate electrode layer. These source contacts are also electrically connected to each other to serve as a common source. The resulting device has three terminals, namely a common source terminal, a common drain terminal, and a common gate electrode that act as the terminals for the hundreds or thousands of individual unit cell transistors. It will be appreciated that the above description is of an n-type MOSFET; the locations of the drain and source would be reversed, and the conductivity types of the n- and p-type regions of the device may be swapped, for a p-type MOSFET.

Pursuant to embodiments of the present invention, semiconductor devices are provided that have improved gate dielectric layers that will exhibit increased lifetimes. When a MOSFET is in its "on" or conducting state, an electric field is generated within the gate dielectric layer of the device. Generally speaking, the strength of this electric field is particularly high in the portions of the gate dielectric layer that are at the corners of the gate electrode. As discussed above, the lifetime of the gate dielectric layer is a function of the intensity of the electric field in the gate dielectric layer. Thus, since the portions of the gate dielectric layer that are at the corners of the gate electrode are subjected to the highest electric fields, these are the regions that will typically first experience breakdown.

Unfortunately, the portion of the gate dielectric layer that experiences the highest electric field values during on-state operation is also the portion that is susceptible to damage as a result of the conventional process that is used to form the semiconductor structure of the MOSFET device. For example, ion implantation and etching steps used to form source regions of the semiconductor structure (e.g., for an n-type MOSFET, or drain regions for a p-type MOSFET) can damage the semiconductor structure. For example, ion implantation can damage the structure into which the ion implantation is performed. Similarly, etching, such as by plasma gas, that is performed on exposed portions of a semiconductor structure can damage the exposed portions. A dielectric such as an oxide that is subsequently provided (e.g., grown) over this damaged portion of the semiconductor structure may have a lower quality. A lower quality dielectric can include, for example, semiconductor lattice damage induced defects (e.g., traps, recombination centers, broken bonds, and/or other oxide defects). As a result, a portion of the gate dielectric layer that directly overlies the source region (or drain region) may be susceptible to breakdown in conventional devices, which may result in a short circuit between the gate electrode and the source region (or drain region) and premature device failure.

Embodiments described herein provide devices, and methods for manufacturing such devices, that improve the breakdown voltage the quality of the gate dielectric layer of the device. Embodiments described herein may space regions of the source/drain that may be damaged due to ion implantation and/or etching away from a channel region of the device. By spacing areas that may have damage (e.g., from ion implantation and/or etching) apart from the channel region, devices and methods described herein allow for the formation of improved gate dielectric adjacent the channel region, which can reduce premature failures and improve device performance of the power MOSFET devices.

Figure 1B:
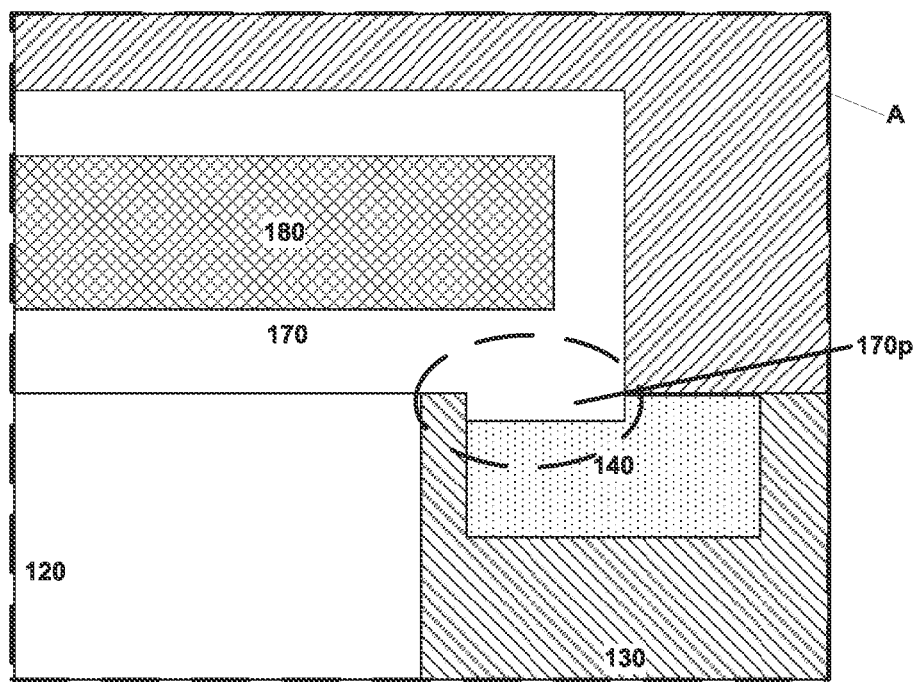
FIG. 1B is a schematic cross-sectional diagram of region 'A' of FIG. 1A.

FIG. 1A is a schematic cross-sectional diagram of a unit cell 100 of a conventional semiconductor device, with areas of concern identified according to some embodiments described herein. FIG. 1B is a schematic cross-sectional diagram of region 'A' of FIG. 1A. For simplicity of description, FIG. 1A only illustrates a single unit cell 100.

As shown in FIG. 1A, the unit cell 100 may be or include a transistor (e.g., a MOSFET) formed using an n-type silicon carbide semiconductor substrate 110. The substrate 110 may comprise, for example, a single crystal 4H SiC substrate that is heavily-doped with n-type impurities (i.e., an n+ silicon carbide substrate). A lightly-doped n-type (e.g., n−) silicon carbide drift layer 120 is provided on the substrate 110. Upper portions of the n-type silicon carbide drift layer 120 may be doped p-type by ion implantation to form p-wells 130. Each p-well 130 may be formed by ion implantation, though the embodiments described herein are not limited thereto.

Heavily-doped (n+) n-type silicon carbide source regions 140 may be formed in upper portions of the p-wells 130. The n-type source regions 140 may be formed by ion implantation. The heavily-doped (n+) n-type silicon carbide regions 140 act as source regions for the unit cell 100. The drift layer 120 and the substrate 110 together act as a common drain region for the unit cell 100. The n-type silicon carbide substrate 110, the n-type silicon carbide drift layer 120, the p-wells 130, and the n-type source regions 140 formed therein may together comprise a semiconductor layer structure 150 of the unit cell 100.

It will be appreciated that the above description is of an n-type MOSFET. In p-type devices, the locations of the source and drain contacts may be reversed, and the conductivity types of the other n- and p-type regions may be swapped. Accordingly, the source region 140 can be referred to as a "source/drain region" 140.

As is known to those skilled in the art, ion implantation is a flexible and convenient method for selectively doping portions of a silicon carbide layer. In an ion implantation process, dopant ions are accelerated to a high energy, usually expressed in keV or MeV, and directed towards a semiconductor lattice. The implants penetrate the lattice and come to rest somewhere within the lattice. The number of ions implanted into a semiconductor layer, referred to as the dose, is usually expressed in terms of ions per square centimeter ($cm^{-2}$). Selective implantation is performed by masking portions of the layer to prevent ions from penetrating the masked portions of layer. The creation of the masks may incorporate patterning and subsequent etching of a masking layer.

Ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer. The ions will implant at different depths into the semiconductor layer so that the predetermined kinetic energy will provide an implant "profile" with varying ion concentrations as a function of depth.

A gate dielectric layer 170 may be formed on the upper surface of the semiconductor layer structure 150. The gate dielectric layer 170 may comprise, for example, a silicon dioxide ($SiO_2$) layer, although other insulating materials, a silicon dioxide ($SiO_2$) layer, although other insulating materials, such as $SiO_xN_y$, $Si_xN_y$, $Al_2O_3$, and the like may be used. The gate dielectric layer 170 may be one or multiple layers. A gate electrode 180 may be formed on the gate dielectric layer 170 opposite the semiconductor layer structure 150. The gate electrode 180 may comprise, for example, a polysilicon or doped silicon layer.

A source contact 190 (e.g., a metal layer) is provided on the n+source regions 140 that acts as a common source contact, and a drain contact 195 (e.g., another metal layer) is provided on the back side of the n+ silicon carbide substrate 110 and acts as the common drain contact of the unit cell 100. A channel region 145 is provided in each p-well 130 between the source region 140 and the drift layer 120. Typically, hundreds, or more commonly, thousands of unit cells such as unit cell 100 would be formed on the semiconductor substrate and electrically connected in parallel to provide the power MOSFET device.

FIG. 1B schematically illustrates region 'A' of FIG. 1A. As illustrated in FIG. 1B, the gate dielectric layer 170 may include a portion 170p (identified with a dashed ellipse) that has an increased thickness with respect to the rest of the gate dielectric layer 170. In FIG. 1B, the shape of the portion 170p of the gate dielectric layer 170 is schematic in nature and not intended to limit the present disclosure. As described herein, the source region 140 may be formed by ion implantation. The ion implantation of the heavily-doped (n+) n-type source region 140 may involve implantation of dopants with a high dose to achieve the highly doped characteristic of the source region 140. The high dose implant may damage the upper surface of the source region 140.

As a result of the damage to the upper surface of the source region 140, the gate dielectric layer 170 formed thereon may be formed to be slightly thicker and of an inferior quality. For example, the thicker portion 170p may include, for example, semiconductor lattice damage induced defects (e.g., traps, recombination centers, broken bonds, and/or other oxide defects). For example, the lower quality dielectric of the thicker portion 170p may have a concentration of semiconductor lattice damage induced defects (e.g., traps, recombination centers, broken bonds, and/or other oxide defects) that is greater than 15% higher than a concentration of similar defects in portions of the dielectric layer 170 that are between a center portion of the gate electrode 180 and the drift layer 120 (e.g., over a JFET region of the device) and/or the channel region 145. The lower quality dielectric of the thicker portion 170p over the source region 140 may result in premature failure of the unit cell 100. Though FIG. 1B illustrates that the thick portion 170p extends into the source region 140, the embodiments of the present invention are not limited thereto. In some embodiments, the thicker portion 170p may result in an extension or "bulge" of the dielectric layer 170 beneath the gate electrode 180 that may cause the edge of the gate electrode 180 to be farther from the upper surface of the semiconductor layer structure 150 than a center of the gate electrode 180. In some embodiments, the thicker portion 170p may result in both an extension into the source region 140 as well as an increase in the separation between the gate electrode 180 and the semiconductor layer structure 150 at the edge of the gate electrode 180.

The problem described above may be particularly acute for SiC devices as compared to other devices, such as devices formed with silicon ("Si"). An activation process in SiC for dopants that have been ion implanted may be between 1400° C. to 1700° C., and as high as 1800° C. As a result, the gate structure for a SiC-based device (e.g., the gate electrode 180) may be formed after the ion implantation and dopant activation of the source regions so as to avoid damage to the gate electrode 180 due to the temperatures of the activation. In contrast, activation of the dopants of an Si-based device that have been ion implanted may occur at temperatures between 900° C. and 1100° C. Si-based devices may therefore have the gate structure (e.g., the gate electrode and gate dielectric layer) in place during ion implantation without risk of damage from the activation. This can result in the source regions being self-aligned with respect to the gate. With SiC, the formation of the gate electrode 180 after the implantation of the source region 140 may result in the gate electrode 180 not being self-aligned with respect to the source regions 140 and overlapping with the source region 140, which may have a damaged surface due to the ion implantation. Thus, the gate dielectric layer 170 of a SiC-based device, such as unit cell 100 of FIG. 1A, may be particularly vulnerable to the formation of the gate dielectric layer 170 with portions having a lower quality. However, the present invention is not limited to SiC-based devices, and semiconductor devices formed using other semiconductor materials may benefit from the embodiments described herein.

Figure 2A:
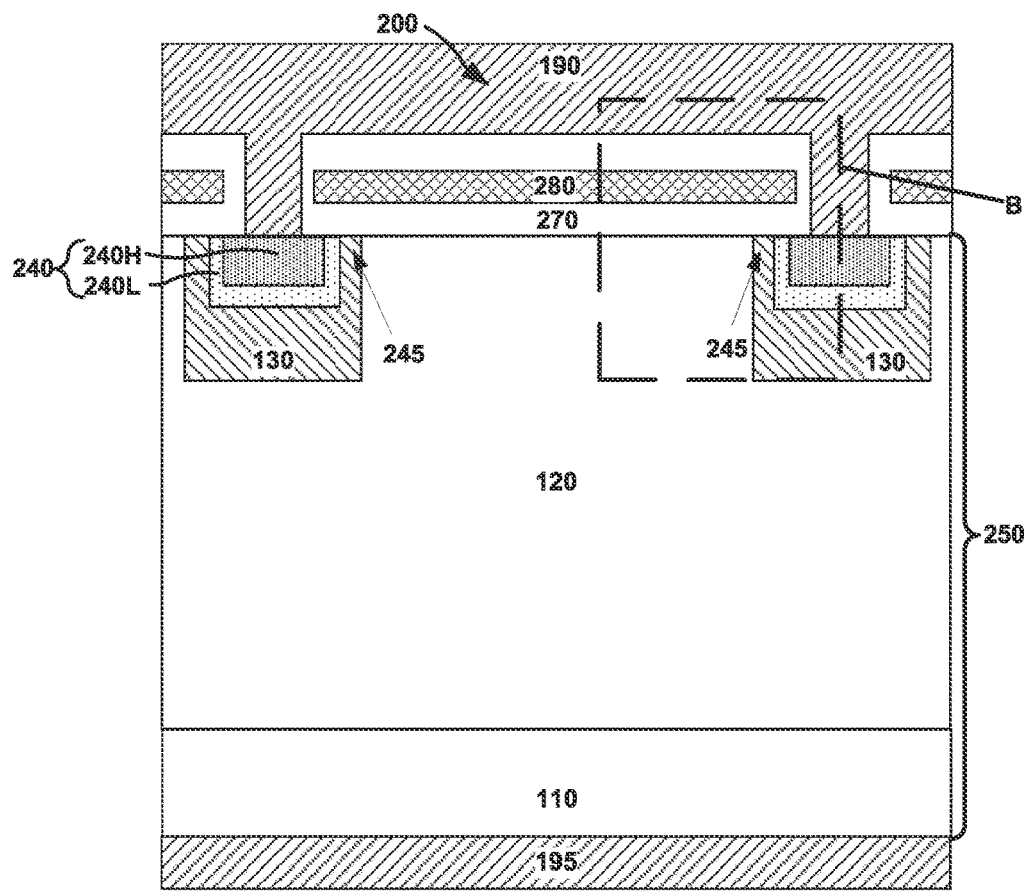
FIG. 2A is a schematic cross-sectional diagram of a unit cell of a semiconductor device, according to some embodiments of the present invention.
Figure 2B:
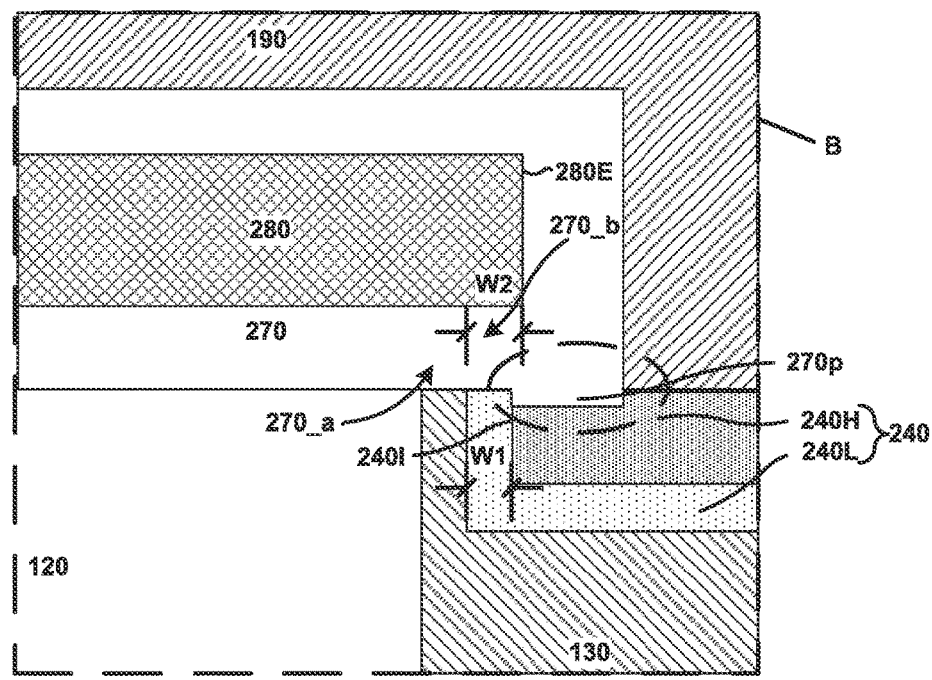
FIG. 2B is a schematic cross-sectional diagram of region 'B' of FIG. 2A.

FIG. 2A is a schematic cross-sectional diagram of a unit cell 200 of a semiconductor device, according to some embodiments of the present invention. FIG. 2B is a schematic cross-sectional diagram of region 'B' of FIG. 2A. FIG. 2A illustrates that the unit cell 200 may be one of a plurality of unit cells adjacent one another.

A description of those elements of FIGS. 2A and 2B that are the same or similar to those of FIGS. 1A and 1B will be omitted for brevity. Accordingly, the description of FIG. 2A will focus on differences with the device previously described.

As illustrated in FIG. 2A, the unit cell 200 of a semiconductor device according to some embodiments described herein may include a substrate 110. The substrate 110 may comprise, for example, a single crystal 4H- or 6H-SiC substrate that is heavily-doped with n-type impurities (i.e., an n+ silicon carbide substrate). In other embodiments, the substrate 110 may be or comprise a different semiconductor material (e.g., a Group III nitride-based material, Si, GaAs, ZnO, InP) or a non-semiconductor material (e.g., sapphire). A drift layer 120 may be formed on the substrate 110, with p-wells 130 formed in the drift layer 120. In some embodiments, an n-type silicon carbide current spreading layer may be formed that comprises the upper portion of the drift layer 120. Source/drain regions 240 may be formed in the p-wells 130. The substrate 110, drift layer 120, p-wells 130, and the source/drain regions 240 formed therein may together comprise a semiconductor layer structure 250 of the unit cell 200. Source contact 190 and drain contact 195 may be formed on the semiconductor layer structure 250.

A gate dielectric layer 270 may be formed on the upper surface of the semiconductor layer structure 250. In some embodiments, the gate dielectric layer 270 can be any stable dielectric with a bandgap approximately 2 eV larger than the semiconductor underneath. The gate dielectric layer 270 can be a multilayer material stack or a single dielectric compound or alloy. The gate dielectric layer 270 may comprise, for example, a silicon dioxide ($SiO_2$) layer, although other insulating materials, such as $SiO_xN_y$, $Si_xN_y$, $Al_2O_3$, and the like may be used. A gate electrode 280 may be formed on the gate dielectric layer 270 opposite the semiconductor layer structure 250. The gate electrode 280 may include, for example, a silicide, doped polycrystalline silicon (poly-Si or poly), and/or a stable conductor.

The source/drain regions 240 may be formed of two n-type regions, a low-concentration source/drain region 240L and a high-concentration source/drain region 240H. The low-concentration source/drain region 240L may be laterally offset (e.g., in a horizontal direction in FIGS. 2A and 2B) from the high-concentration source/drain region 240. The low-concentration source/drain region 240L may have a lower dopant concentration of n-type dopants than the high-concentration source/drain region 240H. In some embodiments, the dopant concentration of the high-concentration source/drain region 240H may be at least two orders of magnitude greater than a dopant concentration of the low-concentration source/drain region 240L. In some embodiments, the dopant concentration of the high-concentration source/drain region 240H may be between one to three orders of magnitude greater than a dopant concentration of the low-concentration source/drain region 240L. In some embodiments, the dopant concentration of the high-concentration source/drain region 240H may be between a same order of magnitude to four orders of magnitude greater than a dopant concentration of the low-concentration source/drain region 240L. In some embodiments, when the low-concentration source/drain region 240L and the high-concentration source/drain region 240H have a same order of magnitude, the doping concentration of the high-concentration source/drain region 240H may be at least twice the doping concentration of the low-concentration source/drain region 240L.

A width of the high-concentration source/drain region 240H (e.g., in the horizontal direction of FIG. 2A) may be less than that of the low-concentration source/drain region 240L. In some embodiments, at least a portion of the high-concentration source/drain region 240H may be within the low-concentration source/drain region 240L. For example, portions of one or both side edges and/or boundaries of the high-concentration source/drain region 240H may be within the low-concentration source/drain region 240L. The inner side edge of the low-concentration source/drain region 240L (e.g., the side edge of the low-concentration source/drain region 240L closest to a center of the gate electrode 280) may extend beyond the inner side edge of the high-concentration source/drain region 240H such that a portion of the low-concentration source/drain region 240L is between the high-concentration source/drain region 240H and the drift layer 120 and/or the p-well 130.

As used herein, the side edge and/or boundary of a region may be used to refer to a location in which the concentration of the region substantially transitions to that of the adjacent region. For example, the side edge of the high-concentration source/drain region 240H may refer to a location on the semiconductor layer structure 250 in which the doping concentration of the high-concentration source/drain region 240H substantially transitions to that of the low-concentration source/drain region 240L. For example, the side edges of the high-concentration source/drain region 240H may refer to locations on lateral edges of the high-concentration source/drain region 240H in which the doping concentration of the high-concentration source/drain region 240H has decreased to an amount that is less than halfway between the doping concentration of the high-concentration source/drain region 240H and the doping concentration of the low-concentration source/drain region 240L. As another example, the side edges of the low-concentration source/drain region 240L may refer to locations on lateral edges of the low-concentration source/drain region 240L in which the conductivity type of the semiconductor layer structure 250 may convert from an n-type (for an n-type MOSFET) of the low-concentration source/drain region 240L to a p-type of the p-well 130.

Figure 2C:
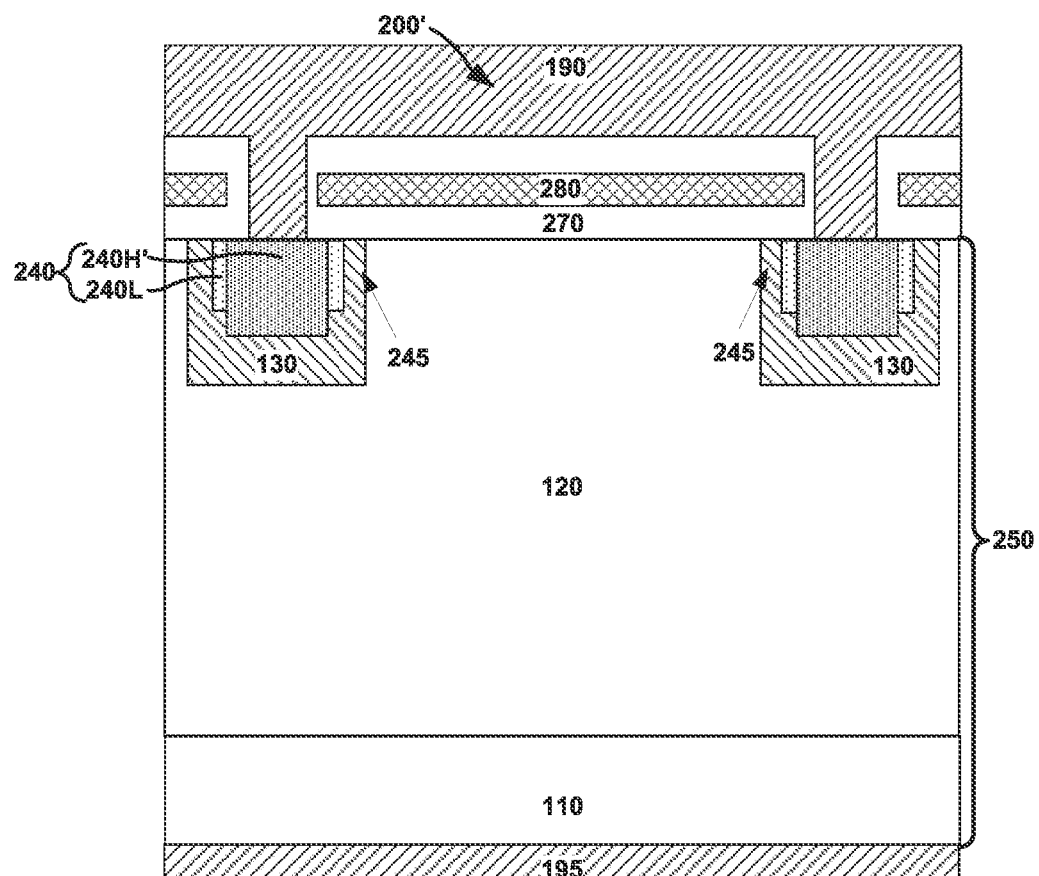
FIG. 2C is a schematic cross-sectional diagram of a unit cell of a semiconductor device, according to some additional embodiments of the present invention.

A channel region 245 is provided in each p-well 130 between the low-concentration source/drain region 240L and the drift layer 120. A width of the channel region 245 between the low-concentration source/drain region 240L and the drift layer 120 may range between 0.2 microns and 2 microns. In some embodiments, the width of the channel region 245 may range between 0.5 microns and 1 micron. A portion of the low-concentration source/drain region 240L may be between the channel region 245 and the high-concentration source/drain region 240H. Though the high-concentration source/drain region 240H is illustrated as having a bottom surface higher (e.g., farther from the substrate 110) than the low-concentration source/drain region 240L, it will be understood that the present invention is not limited thereto. In some embodiments, the bottom surface of the high-concentration source/drain region 240H may be coplanar and/or lower (e.g., closer to the substrate 110) than the bottom surface of the low-concentration source/drain region 240L. For example, FIG. 2C illustrates a schematic cross-sectional diagram of a unit cell 200' of a semiconductor device, according to some additional embodiments of the present invention. As illustrated in FIG. 2C, the bottom surface of the high-concentration source/drain region 240H' may be lower (e.g., closer to the substrate 110) than the bottom surface of the low-concentration source/drain region 240L.

Figure 2D:
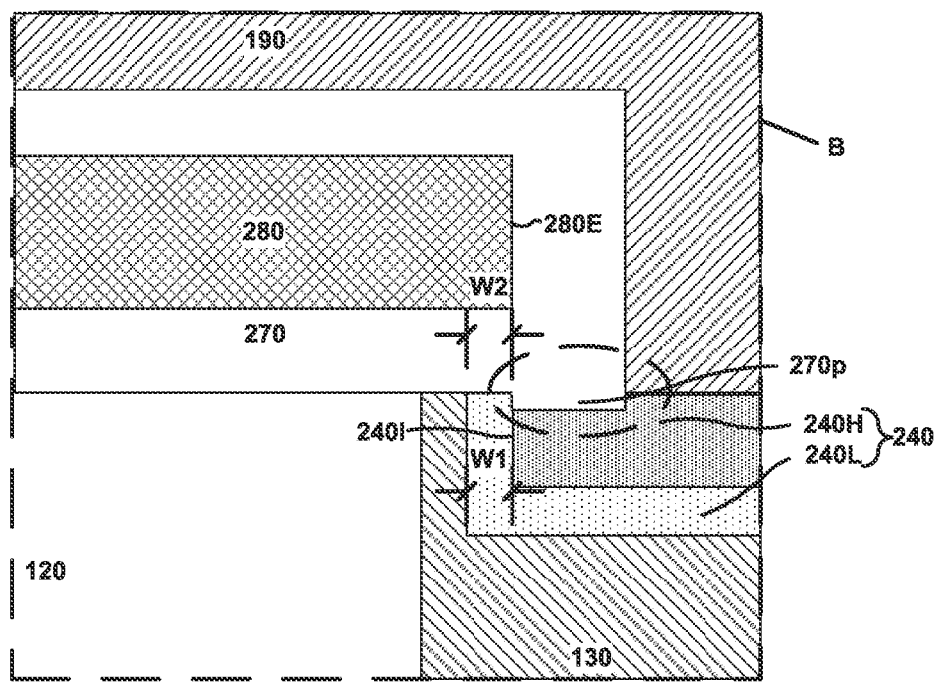
FIGS. 2D and 2E are additional schematic cross-sectional diagrams of region 'B' of FIG. 2A.
Figure 2E:
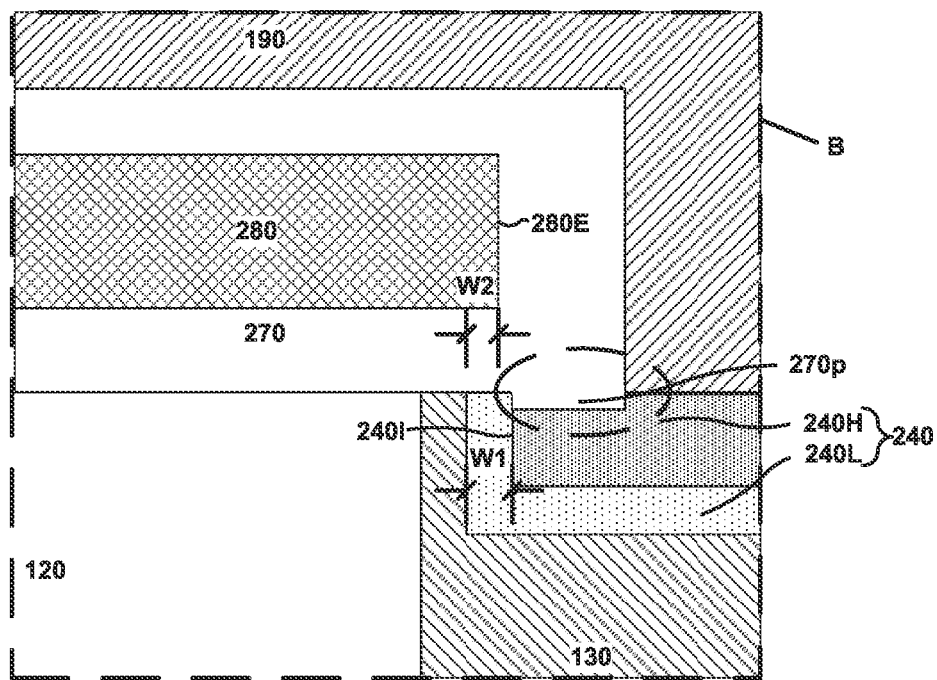

Referring to FIG. 2B, the inner side edge of the high-concentration source/drain region 240H may be offset from the inner side edge of the low-concentration source/drain region 240L by a first distance W1. In some embodiments, the first distance W1 may be 50 angstroms (Å) to 2000 Å. In some embodiments, the first distance W1 may be 75 Å to 1000 Å. In some embodiments, the first distance W1 may be 125 Å to 500 Å. The gate electrode 280 may extend over a portion of the source/drain region 240 (e.g., the combination of the low-concentration source/drain region 240L and the high-concentration source/drain region 240H) by a second distance W2. In some embodiments, the second distance W2 may be greater than W1. That is to say that in some embodiments, the gate electrode 280 may extend over the high-concentration source/drain region 240H. In some embodiments, the second distance W2 may exceed W1 by 100 nm (1000 Å) to 500 nm (5000 Å). Thus, the second distance W2 may range from 1050 Å to 7000 Å. Though the embodiment illustrated in FIGS. 2A and 2B illustrates a device in which the gate electrode 280 extends over the high-concentration source/drain region 240H, the present invention is not limited thereto. In some embodiments, the first distance W1 and the second distance W2 may be equal (e.g., 50 Å to 2000 Å), as illustrated, for example, in FIG. 2D. In some embodiments, the first distance W1 may be larger than the second distance W2, as illustrated, for example, in FIG. 2E. In other words, in some embodiments, the gate electrode 280 may only extend over the low-concentration source/drain region 240L and not the high-concentration source/drain region 240H.

In some embodiments, an edge 280E of the gate electrode 280 may be located near an interface 2401 between the low-concentration source/drain region 240L and the high-concentration source/drain region 240H. In some embodiments, the edge 280E of the gate electrode 280 may overlap to within 100 nm (1000 Å) to 500 nm (5000 Å) of the interface 2401 between the low-concentration source/drain region 240L and the high-concentration source/drain region 240H. Stated another way, an imaginary line that that extends normal to the upper surface of the semiconductor layer structure 250 and contacts the edge 280E of the gate electrode 280 may be within 100 nm to 500 nm of the interface 2401 between the low-concentration source/drain region 240L and the high-concentration source/drain region 240H. The interface 2401 between the low-concentration source/drain region 240L and the high-concentration source/drain region 240H may be located between an inner side edge of the high-concentration source/drain region 240H and the low-concentration source/drain region 240L. The edge 280E of the gate electrode 280 may overlap either the high-concentration source/drain region 240H or the low-concentration source/drain region 240L. In some embodiments, the edge 280E of the gate electrode 280 may overlap to within 500 Å of the interface 2401 between the low-concentration source/drain region 240L and the high-concentration source/drain region 240H. In some embodiments, the edge 280E of the gate electrode 280 may overlap to within 100 Å of the interface 2401 between the low-concentration source/drain region 240L and the high-concentration source/drain region 240H. In some embodiments, the edge 280E of the gate electrode 280 may overlap directly over the interface 2401 between the low-concentration source/drain region 240L and the high-concentration source/drain region 240H. Therefore, according to some embodiments described herein, the edge 280E of the gate electrode 280 may be laterally separated from the interface 2401 between the low-concentration source/drain region 240L and the high-concentration source/drain region 240H by 5000 Å or less.

In some embodiments, the dopant dose used in the formation of the low-concentration source/drain region 240L may be lower than a dopant dose of the high-concentration source/drain region 240H. As a result, a surface damage of the low-concentration source/drain region 240L may be less than that of the high-concentration source/drain region 240H. As shown in FIGS. 2A and 2B, portions of the high-concentration source/drain region 240H (and the surface damage associated therewith) may be physically remote from a portion of the source/drain region 240 and/or the channel region 245 over which the gate electrode 280 overlaps. As with the embodiment of the conventional device of FIG. 1A, the gate dielectric layer 270 according to embodiments described herein may, in some embodiments, still have a thicker portion 270p (illustrated schematically within the dashed ellipse of FIG. 2B). However, due to the offset of the high-concentration source/drain region 240H from the gate electrode 280, a portion 270_b of the gate dielectric layer 270 that is between the gate electrode 280 and the source/drain region 240 (e.g., that is on both the gate electrode 280 and the low-concentration source/drain region 240L) and a portion 270_a between the gate electrode 280 and the channel region 245 (e.g., that is on both the gate electrode 280 and the channel region 245) may be substantially uniform in thickness (e.g., having a substantially constant thickness) and/or may have a high quality.

For example, in some embodiments, the portion 270_b of the gate dielectric layer 270 that is between the gate electrode 280 and the source/drain region 240 may have a substantially uniform thickness that does not vary by more than 15% from a thickness of the portion 270_a of the gate dielectric layer 270 that is between the gate electrode 280 and the channel region 245. In some embodiments, the portion 270_b of the gate dielectric layer 270 that is between the gate electrode 280 and the source/drain region 240 may have a substantially uniform thickness that does not vary by more than 20% from a thickness of the portion 270_a of the gate dielectric layer 270 that is between the gate electrode 280 and the channel region 245. That is to say that any deformation of the gate dielectric layer 270 (such as portion 270p) may occur with a portion of the gate dielectric layer 270 that is substantially remote from the channel region 245. In FIG. 2B, the shape of the portion 270p of the gate dielectric layer 270 is schematic in nature and not intended to limit the present disclosure.

Similarly, in some embodiments, the portion 270_b of the gate dielectric layer 270 that is between the gate electrode 280 and the source/drain region 240 may have a concentration of semiconductor lattice damage induced defects (e.g., traps, recombination centers, broken bonds, and/or other oxide defects) that does not vary by more than 10% from a concentration of similar defects of the portion 270_a of the gate dielectric layer 270 that is between the gate electrode 280 and the channel region 245. In some embodiments, the portion 270_b of the gate dielectric layer 270 that is between the gate electrode 280 and the source/drain region 240 may have a concentration of semiconductor lattice damage induced defects (e.g., traps, recombination centers, broken bonds, and/or other oxide defects) that does not vary by more than 20% from a concentration of similar defects of the portion 270_a of the gate dielectric layer 270 that is between the gate electrode 280 and the channel region 245. That is to say that any increased concentration of defects in the gate dielectric layer 270 (such as in portion 270p) may occur with a portion of the gate dielectric layer 270 that is substantially remote from the channel region 245.

By maintaining a uniformly thick and high quality gate dielectric layer 270 between the gate electrode 280 and the source/drain region 240 and/or the channel region 245, the issues related to gate breakdown that may occur in the conventional device can be reduced and/or avoided. Devices according to the present invention may have improved reliability and higher performance.

The semiconductor layer structure 250 of FIGS. 2A and 2B is merely an example, and other configurations of the semiconductor layer structure 250 may be used without deviating from the embodiments described herein. For example, the embodiments described herein may be utilized in semiconductor devices which are gate-controlled, including semiconductor layer structures 250 that are controlled by gate electrodes utilizing a metal-oxide and/or metal-insulator interface, such as a MOSFET, MISFET, or an IGBT device, to name a few. Thus, it will be understood that the semiconductor layer structure 250 can take multiple other forms without deviating from the embodiments described herein.

FIGS. 3 to 13 are schematic cross-sectional views explaining a method for fabrication of a unit cell of a semiconductor device according to some embodiments of the present invention.

Figure 3:
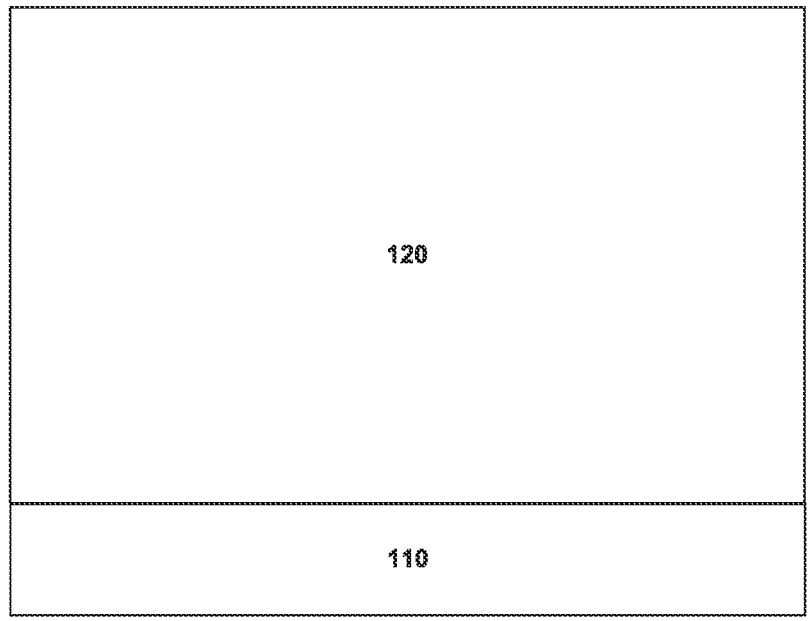
FIGS. 3 to 13 are schematic cross-sectional views explaining a method for fabrication of a unit cell of a semiconductor device according to some embodiments of the present invention.

Referring to FIG. 3, a substrate 110 is provided and a drift layer 120 is formed on the substrate 110 via epitaxial growth. In some embodiments, the substrate 110 is a heavily-doped (n+) n-type silicon carbide substrate and the drift layer 120 is a lightly-doped (n) silicon carbide drift layer 120, though the embodiments described herein are not limited thereto. In some embodiments, an n-type silicon carbide current spreading layer may be formed that comprises the upper portion of the drift layer 120.

Figure 4:
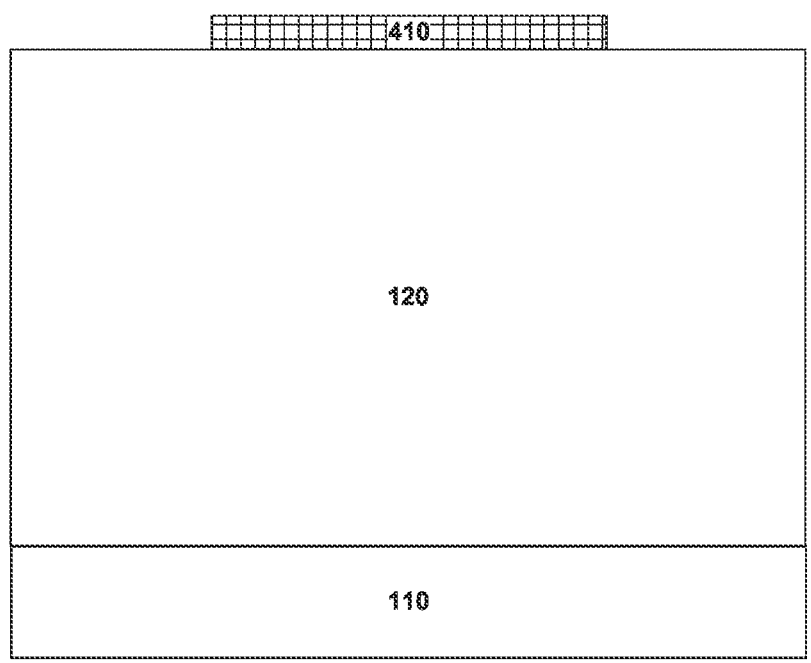

Referring to FIG. 4, a hard mask 410 may be formed on the drift layer 120. The hard mask 410 may be formed of, for example, a photo resist and/or oxide. The hard mask 410 may be formed by depositing a layer of hard mask material on the surface of the drift layer 120 and then patterning/etching the hard mask material to form the hard mask 410 that exposes areas of the surface of the drift layer 120. In some embodiments, the hard mask 410 may be formed over a location of the drift layer 120 that corresponds to the active area of the to-be-formed unit cell. FIG. 4 does not illustrate additional hard masks that may be formed over adjacent portions of the drift layer 120.

Figure 5:
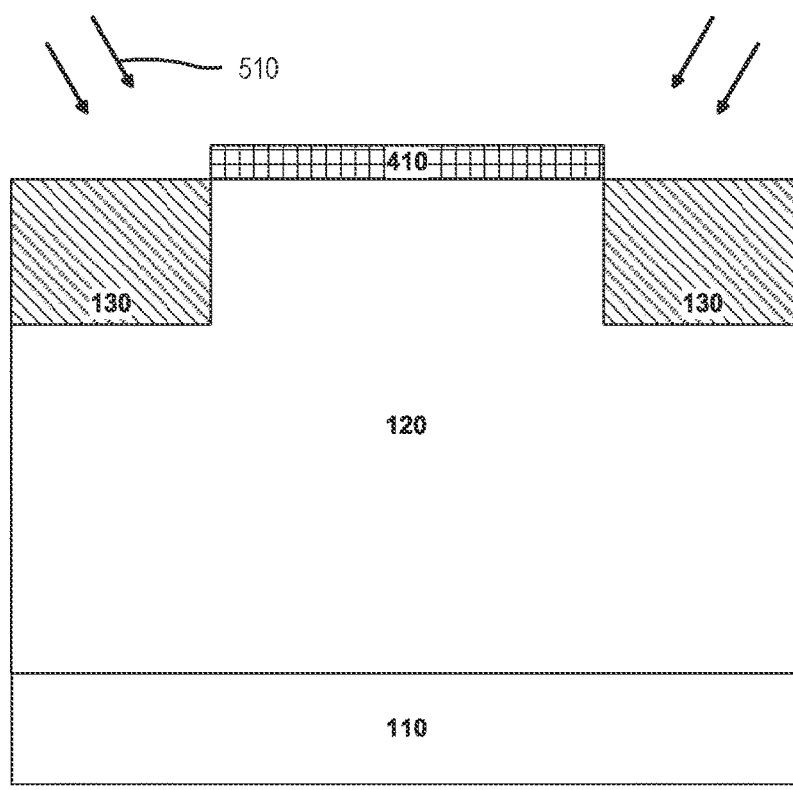

Referring to FIG. 5, an ion implantation operation 510 may be performed. The ion implantation operation 510 may implant p-type dopants into the drift layer 120 to form p-wells 130. In some embodiments, the ion implantation operation 510 may be performed at a dose of $1\times10^{13}$ dopants/cm$^2$ to $1.5\times10^{13}$ dopants/cm$^2$, but the present invention is not limited thereto. In some embodiments, the ion implantation operation 510 may be performed at a doses ranging from between $1\times10^{12}$ dopants/cm$^2$ to $1\times10^{14}$ dopants/cm$^2$. The p-well 130 may be formed between the hard mask 410 of the to-be-formed unit cell illustrated in FIG. 5 and an adjacent unit cell that is not shown in the figure.

Figure 6:
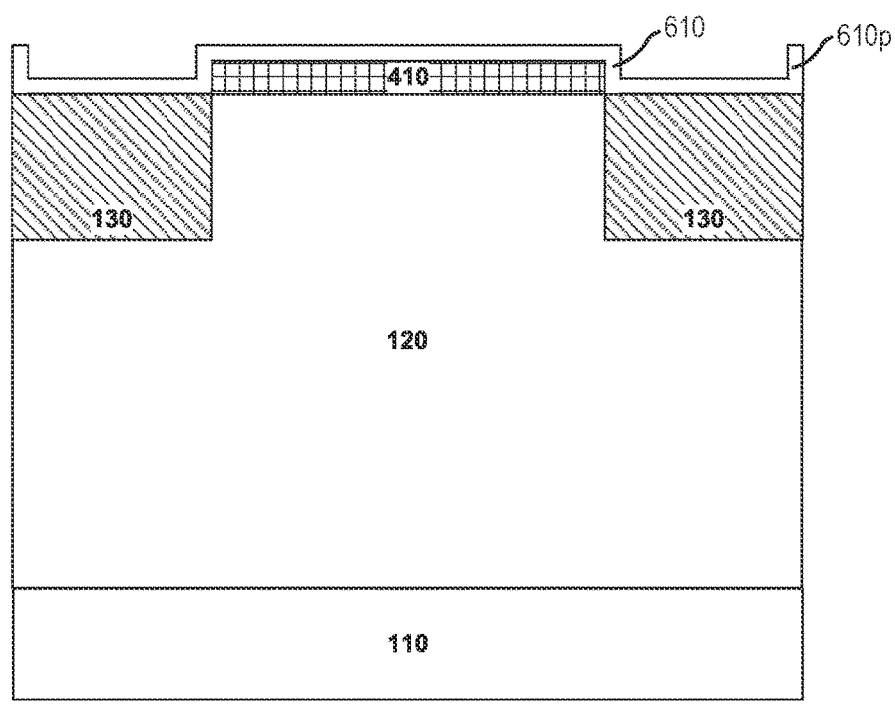

Referring to FIG. 6, a layer of mask material 610 may be formed on the hard mask 410 and an upper surface of the drift layer 120 and p-wells 130. The mask material 610 may be formed of an oxide and/or photoresist. The deposition of the mask material 610 may be controlled to provide the layer of mask material 610 with a thickness of between 0.2 microns and 2 microns though the present invention is not limited thereto. FIG. 6 illustrates that a portion 610p of the mask material 610 may be formed on an adjacent hard mask (not shown) for an adjacent unit cell.

Figure 7:
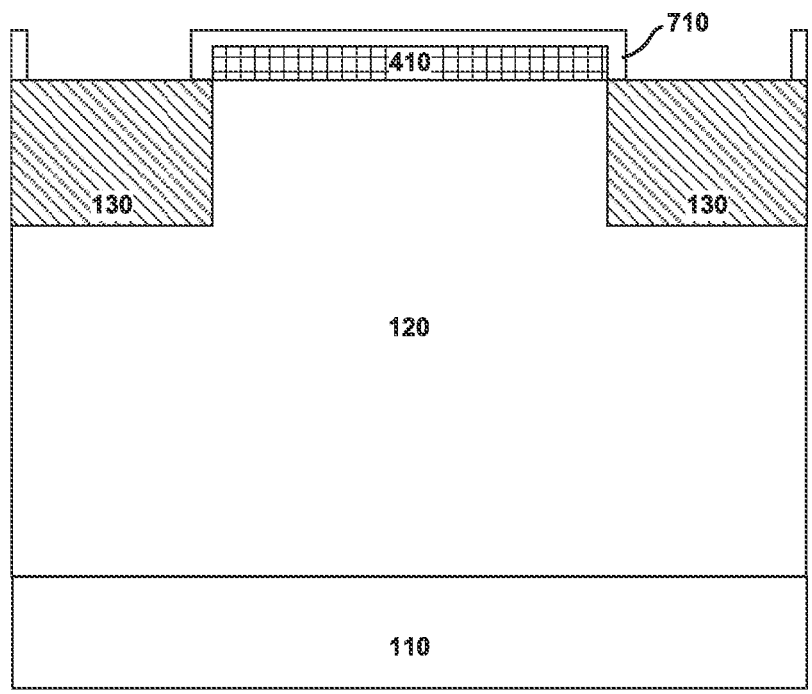

Referring to FIG. 7, the mask material 610 of FIG. 6 may be patterned and etched (e.g., anisotropically) to form a first spacer layer 710 that exposes an upper surface of the p-wells 130. The first spacer layer 710 may be formed on an upper surface and sidewalls of the hard mask 410. The first spacer layer 710 may form spacers having a thickness of between 0.2 microns and 2 microns on the sidewalls of the hard mask 410.

Figure 8:
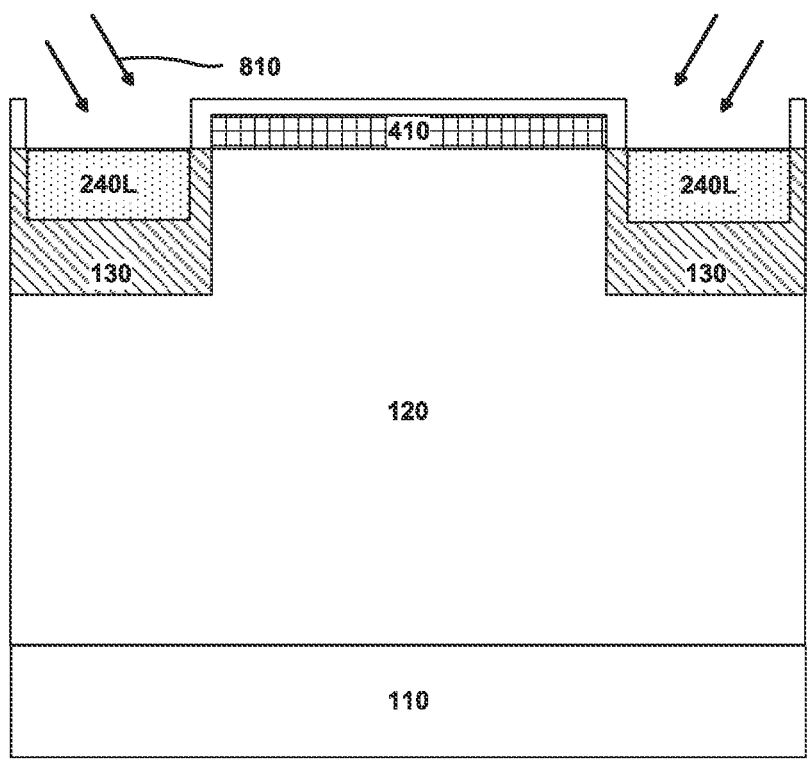

Referring to FIG. 8, an ion implantation operation 810 may be performed. The ion implantation operation 810 may implant n-type dopants into the p-wells 130 to form the low-concentration source/drain regions 240L. In some embodiments, the ion implantation operation 810 may be performed at a dose of $3\times10^{13}$ dopants/cm$^2$ to $4.5\times10^{13}$ dopants/cm$^2$, but the present invention is not limited thereto. In some embodiments, the ion implantation operation 810 may be performed at a dose that is between $1\times10^{12}$ dopants/cm$^2$ to $1\times10^{15}$ dopants/cm$^2$. In some embodiments, the ion implantation operation 810 may be performed at a dose that is 2 to 3 times the dose used in the ion implantation operation 510 of the p-wells 130 described with respect to FIG. 5. In some embodiments, the ion implantation operation 810 may be performed at room temperature.

Figure 9:
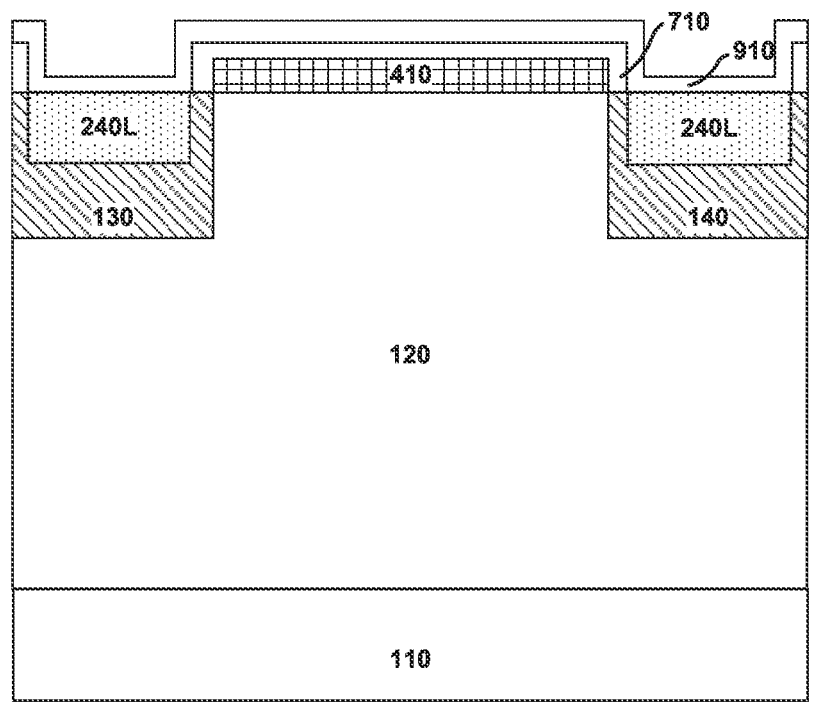

Referring to FIG. 9, a layer of mask material 910 may be formed on the first spacer layer 710, an upper surface of the drift layer 120, the p-wells 130, and the low-concentration source/drain regions 240L. The mask material 910 may be formed of an oxide and/or photoresist. The deposition of the mask material 910 may be controlled to provide a layer of the mask material 910 with a thickness of between 50 Å to 2000 Å, though the present invention is not limited thereto. In some embodiments, the thickness of the mask material 910 may be 75 Å to 1000 Å. In some embodiments, the thickness of the mask material 910 may be 125 Å to 500 Å.

Figure 10:
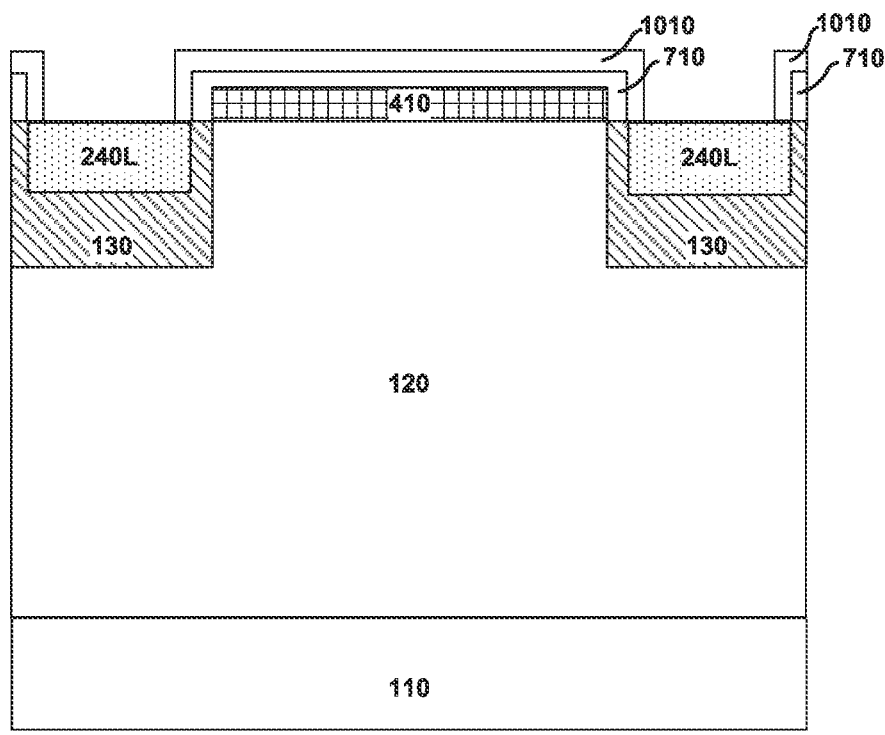

Referring to FIG. 10, the mask material 910 of FIG. 9 may be patterned and etched (e.g., anisotropically) to form a second spacer layer 1010. The second spacer layer 1010 may be formed on an upper surface and sidewalls of the first spacer layer 710 as well as an upper surface of the p-wells 130 and the low-concentration source/drain regions 240L. The second spacer layer 1010 may form spacers having a thickness of between 50 Å to 2000 Å on the sidewalls of the first spacer layer 710. The width of the spacers may correspond to the first distance W1 discussed herein with respect to FIG. 2B. The second spacer layer 1010 may expose a first portion of the low-concentration source/drain regions 240L. Due to a thickness of the second spacer layer 1010, a second portion of the low-concentration source/drain regions 240L adjacent respective inner side edges (e.g., adjacent the hard mask 410) of the low-concentration source/drain regions 240L that is approximately 50 Å to 2000 Å wide may be covered by the second spacer layer 1010. In some embodiments, the width of the second portion of the low-concentration source/drain regions 240L may be 75 Å to 1000 Å. In some embodiments, the width of the second portion of the low-concentration source/drain regions 240L may be 125 Å to 500 Å.

Figure 11:
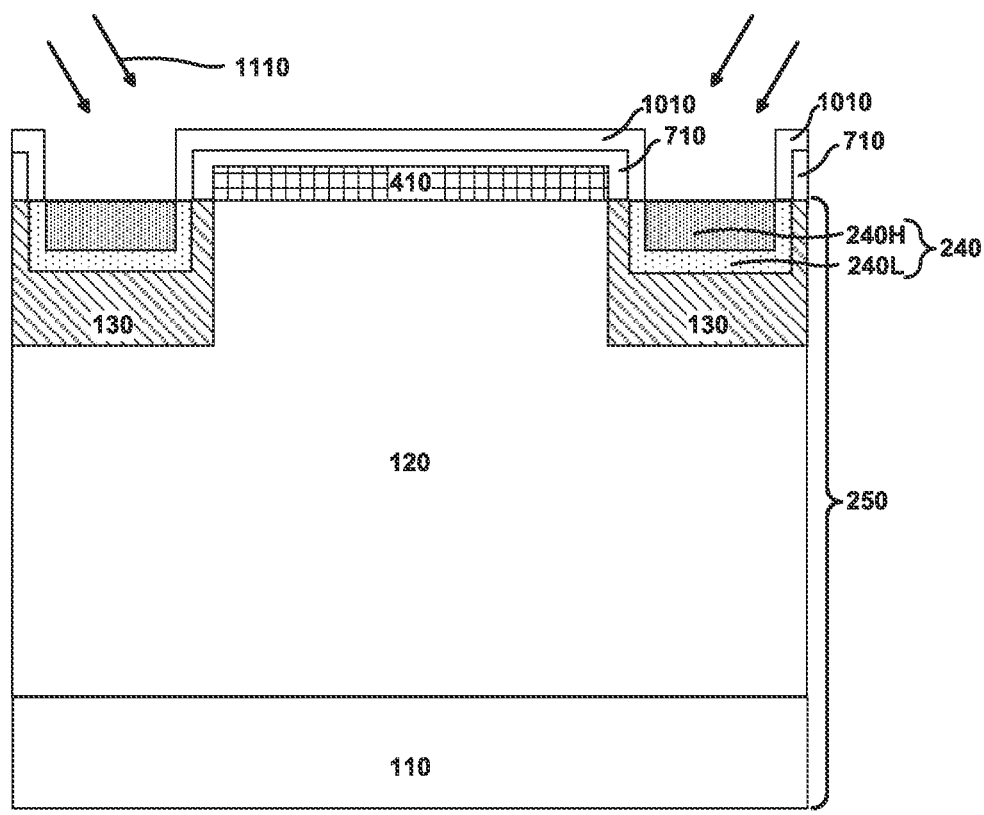

Referring to FIG. 11, an ion implantation operation 1110 may be performed. The ion implantation operation 1110 may implant n-type dopants into the low-concentration source/drain regions 240L to form the high-concentration source/drain regions 240H. In some embodiments, the ion implantation operation 1110 may be performed at a dose of $1\times10^{15}$ dopants/cm$^2$ to $5\times10^{15}$ dopants/cm$^2$, or higher, but the present invention is not limited thereto. In some embodiments, the ion implantation operation 1110 may be performed at a dose between $5\times10^{14}$ dopants/cm$^2$ to $5\times10^{16}$ dopants/cm$^2$. In some embodiments, the ion implantation operation 1110 may be performed at between 300° C. to 600° C. The high-concentration source/drain regions 240H and the low-concentration source/drain regions 240L may together form the source/drain region 240. The source/drain regions 240, the p-wells 130, the drift layer 120, and the substrate 110 may form the semiconductor layer structure 250.

Figure 12:
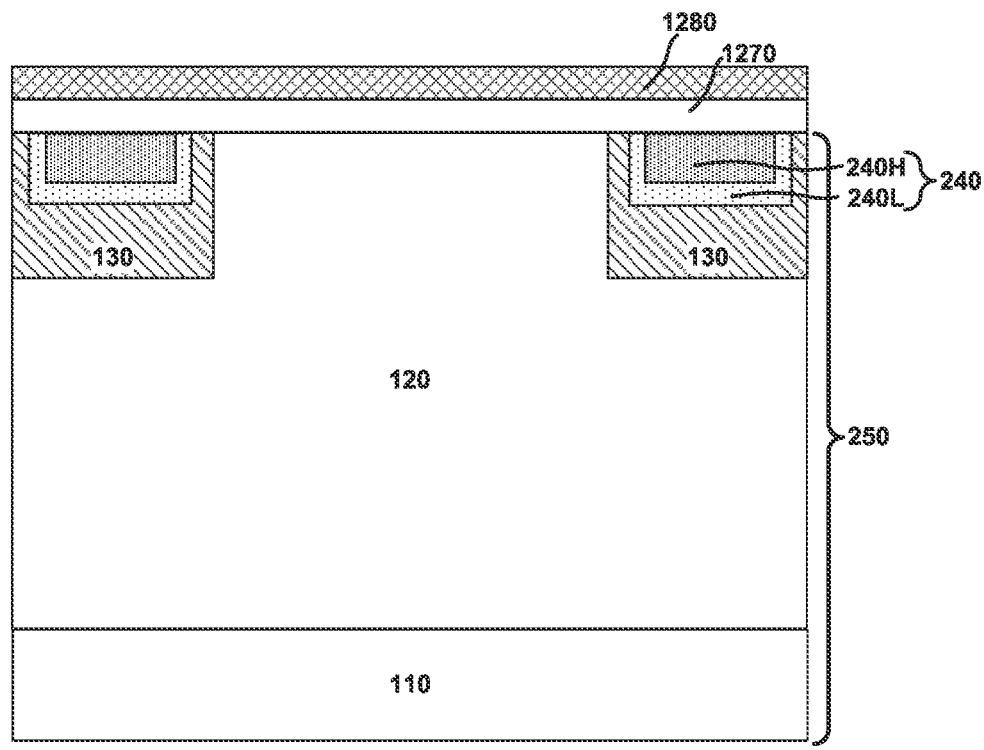

Referring to FIG. 12, the hard mask 410, the first spacer layer 710, and the second spacer layer 1010 may be removed (e.g., via a lift-off process). In some embodiments, an activation operation may be performed to activate the ion-implanted dopants. Next, a layer of gate dielectric material 1270 may be formed on the upper surface of a semiconductor layer structure 250. In some embodiments, the gate dielectric material 1270 may be or include a silicon dioxide (SiO$_2$) layer, although other insulating materials, such as SiO$_x$N$_y$, Si$_x$N$_y$, Al$_2$O$_3$, and the like may be used. In some embodiments, a quality of the gate dielectric material 1270 may be higher (e.g., fewer semiconductor lattice damage induced defects such as traps, recombination centers, broken bonds, and/or other oxide defects) over the low-concentration source/drain regions 240L than over the high-concentration source/drain regions 240H. The gate dielectric material 1270 may be one or multiple layers. In some embodiments, the gate dielectric material 1270 may be thermally grown. A gate electrode layer 1280 may be formed on the layer of gate dielectric material 1270.

Figure 13:
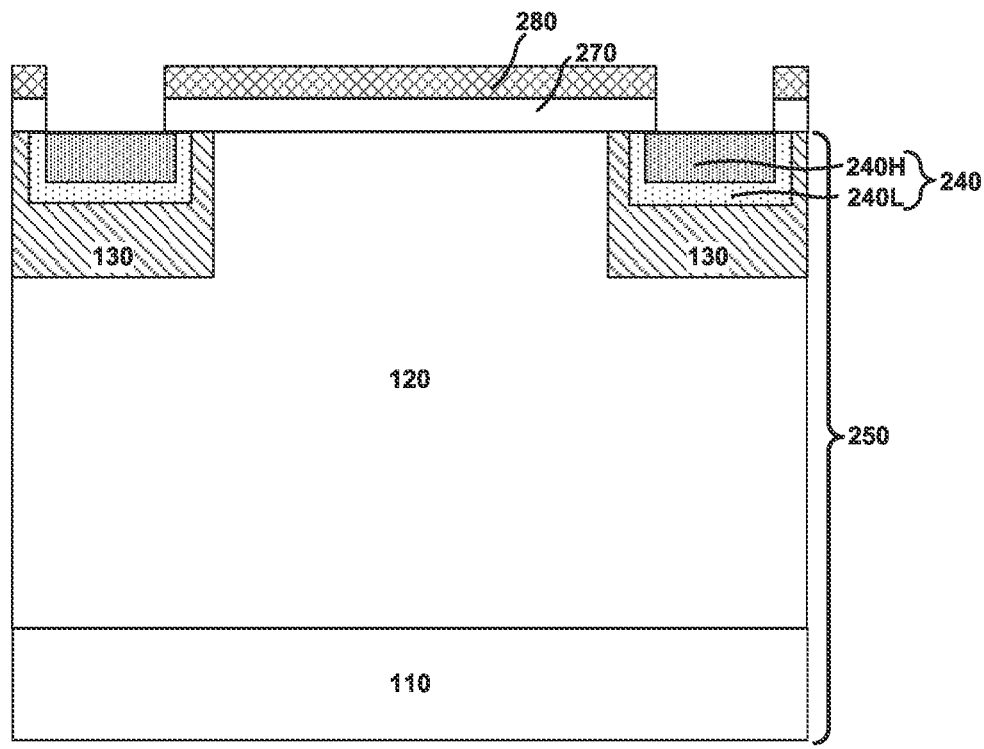

Referring to FIG. 13, the gate dielectric material 1270 and the gate electrode layer may be patterned and etched to form gate dielectric layer 270 and gate electrode 280. The gate dielectric layer 270 and gate electrode 280 may be formed over the drift layer 120 between adjacent ones of the p-wells 130 and may extend onto the edges of the p-wells 130 and n-type source/drain regions 240. In some embodiments, the gate electrode 280 may extend over a portion of the source/drain region 240 (e.g., the combination of the low-concentration source/drain region 240L and the high-concentration source/drain region 240H) for a particular distance (e.g., the second distance W2 discussed with respect to FIGS. 2B, 2D and 2E). In some embodiments, an edge of the gate electrode 280 may be within 1000 Å to 5000 Å of an interface where the inner side edge of the high-concentration source/drain region 240H meets the low-concentration source/drain region 240L. In some embodiments, the edge of the gate electrode 280 may be within 500 Å, or within 100 Å of the interface. Though the gate electrode 280 and the gate dielectric layer 270 are illustrated as having coplanar sidewalls, the embodiments described herein are not limited thereto. In some embodiments, for example, the gate dielectric layer 270 may extend out from the etched gate electrode 280.

Referring back to FIGS. 2A and 2B, a protective layer may be disposed on the gate electrode 280 and the gate dielectric layer 270. In some embodiments, the protective layer may be a nitride and/or oxide. The protective layer may extend beyond a sidewall of the gate electrode 280 to protect the gate electrode 280 against a short with the to-be-applied source contact 190. The protective layer and/or the gate dielectric layer 270 may be patterned/etched to create source contact holes that expose the high-concentration source/drain region 240H.

The source contact 190 (e.g., a metal layer) may be applied on the gate electrode 280 and the source/drain region 240. At least a portion of the source contact 190 may contact the high-concentration source/drain region 240H of the source/drain region 240. Drain contact 195 (e.g., another metal layer) may be provided on the back side of the substrate 110.

Embodiments described herein have addressed mechanisms by which damage caused by ion implantation may be reduced and/or removed at the surface of a semiconductor layer structure near a channel region below a gate electrode of a semiconductor device. However, the present invention is not limited thereto. There are other types of surface damage that can be favorably addressed by the embodiments described herein.

For example, etching procedures, such as plasma etching, that are performed on an exposed surface of a semiconductor layer structure may also damage the surface. Referring to FIG. 7, the etching of the layer of mask material 610 to form the first spacer layer 710 may also damage the surface of the semiconductor layer structure 250. In such an instance, the damage to the surface of the semiconductor layer structure 250 may be in portions of the semiconductor layer structure 250 that may eventually be adjacent the channel layer 245 (see FIGS. 2A and 2B). Thus, though the embodiments previously described herein may reduce surface damage on surfaces of the low-concentration source/drain region 240L due to ion implantation, additional improvements may be made that further reduce the damage that may occur as a result of pattern etching during processing of the device.

FIGS. 14 to 18 are schematic cross-sectional views explaining an additional method for fabrication of a unit cell of a semiconductor device according to some embodiments of the present invention.

Figure 14:
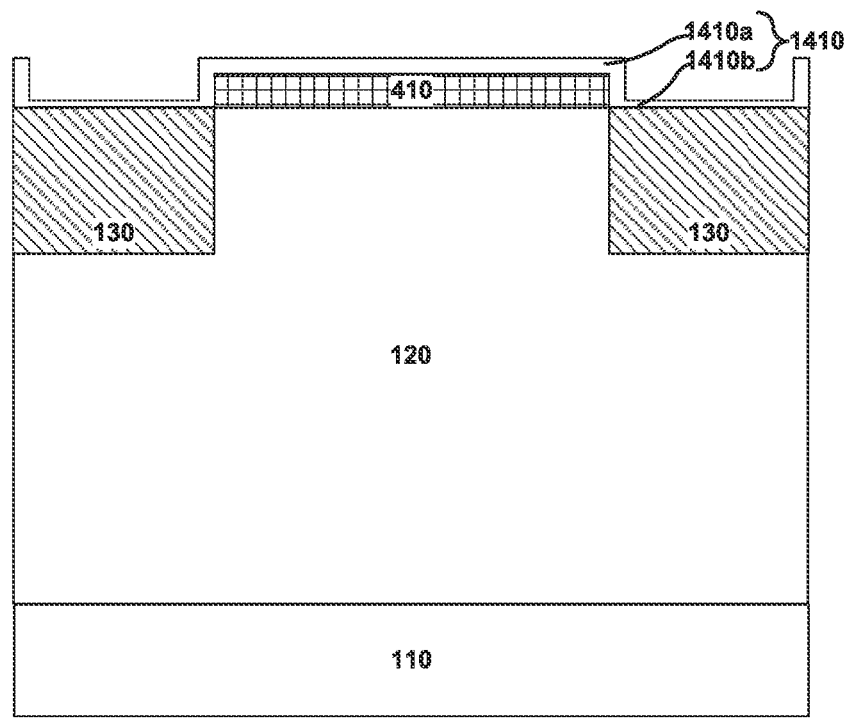
FIGS. 14 to 18 are schematic cross-sectional views explaining an additional method for fabrication of a unit cell of a semiconductor device according to some embodiments of the present invention.

According to the method of FIGS. 14 to 18, processing of the device may occur similarly to that illustrated in FIGS. 3 to 6, and a duplicate description thereof will be omitted. Referring to FIG. 14, the layer of mask material 610 of FIG. 6 may be patterned and etched (e.g., anisotropically) to form a first spacer layer 1410. The first spacer layer 1410 may have a first portion 1410a that is formed on an upper surface and sidewalls of the hard mask 410. The first portion 1410a of the first spacer layer 1410 may form spacers having a thickness of between 0.2 microns and 2 microns (i.e., 2000 Å to 20000 Å) on the sidewalls of the hard mask 410. The first spacer layer 1410 may also have a second portion 1410b that is formed on an upper surface of the p-wells 130. A thickness of the second portion 1410b may be approximately 100 Å. In some embodiments, the thickness of the second portion 1410b may be between 50 Å to 500 Å. In some embodiments, the second portion 1410b of the first spacer layer 1410 may be formed by a timed anisotropic etch. By leaving residual portions (e.g., second portion 1410b) of the first spacer layer 1410 on the p-wells 130, damage to the upper surface of the p-wells 130 may be reduced.

Figure 15:
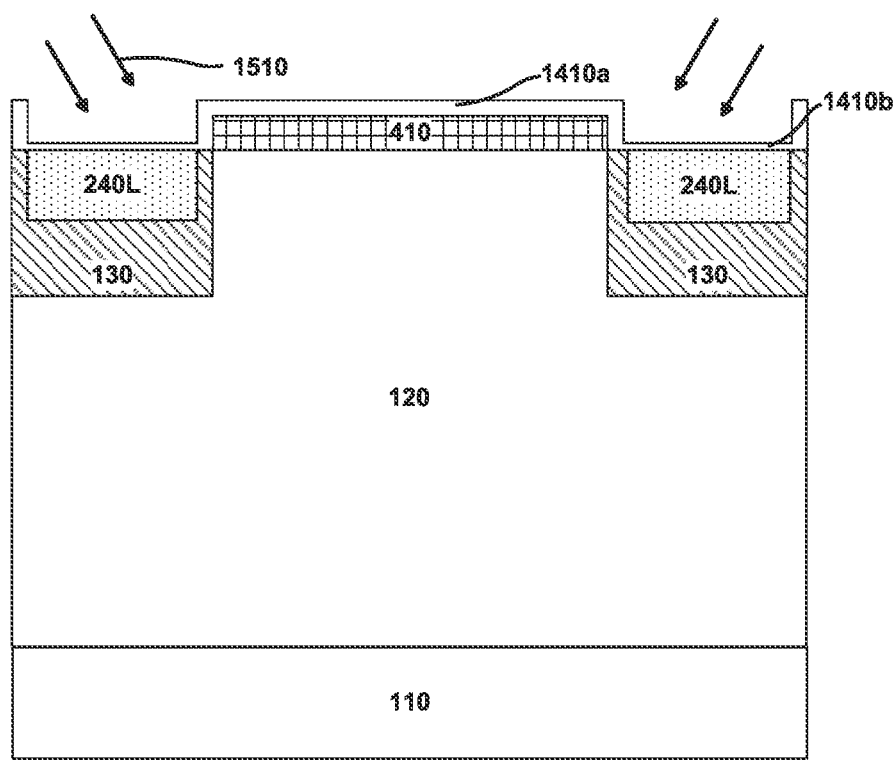

Referring to FIG. 15, an ion implantation operation 1510 may be performed. The ion implantation operation 1510 may implant n-type dopants into the p-wells 130 through the second portion 1410b of the first spacer layer 1410 to form the low-concentration source/drain regions 240L. In some embodiments, the ion implantation operation 1510 may be performed at a dose of $3\times10^{13}$ dopants/cm$^2$ to $4.5\times10^{13}$ dopants/cm$^2$, but the present invention is not limited thereto. In some embodiments, the ion implantation operation 1510 may be performed at a dose that is between $1\times10^{12}$ dopants/cm$^2$ to $1\times10^{15}$ dopants/cm$^2$. In some embodiments, the ion implantation operation 1510 may be performed at a dose that is 2 to 3 times the dose used in the ion implantation operation 510 of the p-wells 130 described herein with respect to FIG. 5. In some embodiments, the ion implantation operation 1510 may be performed at a higher energy than that of an implant performed without a residual mask (e.g., such as that discussed herein with respect to FIG. 8).

Figure 16:
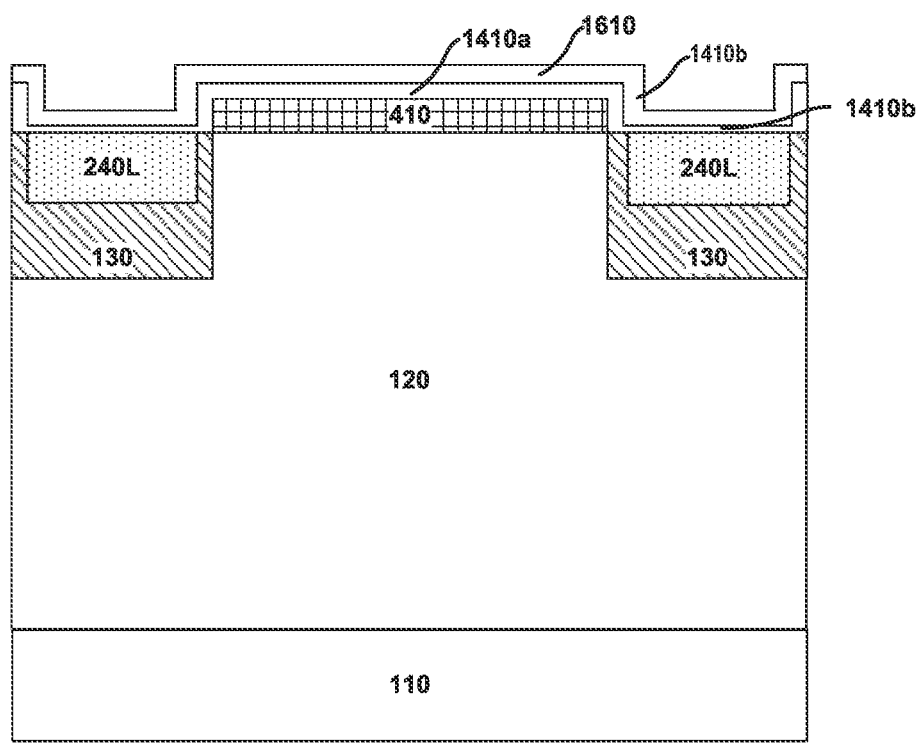

Referring to FIG. 16, a layer of mask material 1610 may be formed on the first portion 1410a and the second portion 1410b of the first spacer layer 1410. The mask material 1610 may be formed of an oxide and/or photoresist. The deposition of the mask material 1610 may be controlled to provide the layer of mask material 1610 with a thickness of between 50 Å to 2000 Å, though the present invention is not limited thereto. In some embodiments, the thickness of the mask material 1610 may be 75 Å to 1000 Å. In some embodiments, the thickness of the mask material 1610 may be 125 Å to 500 Å.

Figure 17:
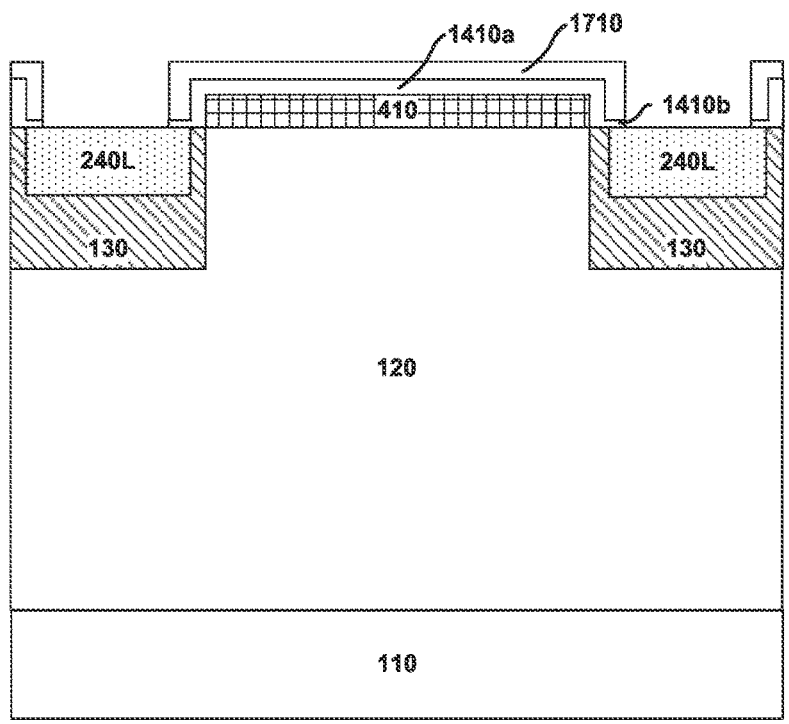

Referring to FIG. 17, the layer of mask material 1610 of FIG. 16 may be patterned and etched (e.g., anisotropically) to form a second spacer layer 1710. The etching of the mask material 1610 may etch portions of the mask material 1610 and the second portion 1410b of the first spacer layer 1410 that are on the low-concentration source/drain region 240L. The second spacer layer 1710 may be formed on an upper surface and sidewalls of the first portion 1410a of the first spacer layer 1410, as well as on remaining portions of the second portion 1410b of the first spacer layer 1410 that are on the an upper surface of the p-wells 130 and the low-concentration source/drain regions 240L. The second spacer layer 1710 may form spacers having a thickness of between 50 Å to 2000 Å on the sidewalls of the first portion 1410a of the first spacer layer 1410. The width of the spacers may correspond to the first distance W1 discussed herein with respect to FIG. 2B. The second spacer layer 1710 may expose a first portion of the low-concentration source/drain regions 240L. Due to a thickness of the second spacer layer 1710, a second portion of the low-concentration source/drain regions 240L adjacent respective inner side edges (e.g., adjacent the hard mask 410) of the low-concentration source/drain regions 240L that is approximately 50 Å to 2000 Å wide may be covered by the second spacer layer 1710. In some embodiments, the width of the second portion of the low-concentration source/drain regions 240L may be 75 Å to 1000 Å. In some embodiments, the width of the second portion of the low-concentration source/drain regions 240L may be 125 Å to 500 Å. In some embodiments, the etching of the layer of mask material 1610 to form the second spacer layer 1710 may not leave residual portions as were left with the etching of the layer of mask layer 610 as discussed herein with respect to FIG. 14.

Figure 18:
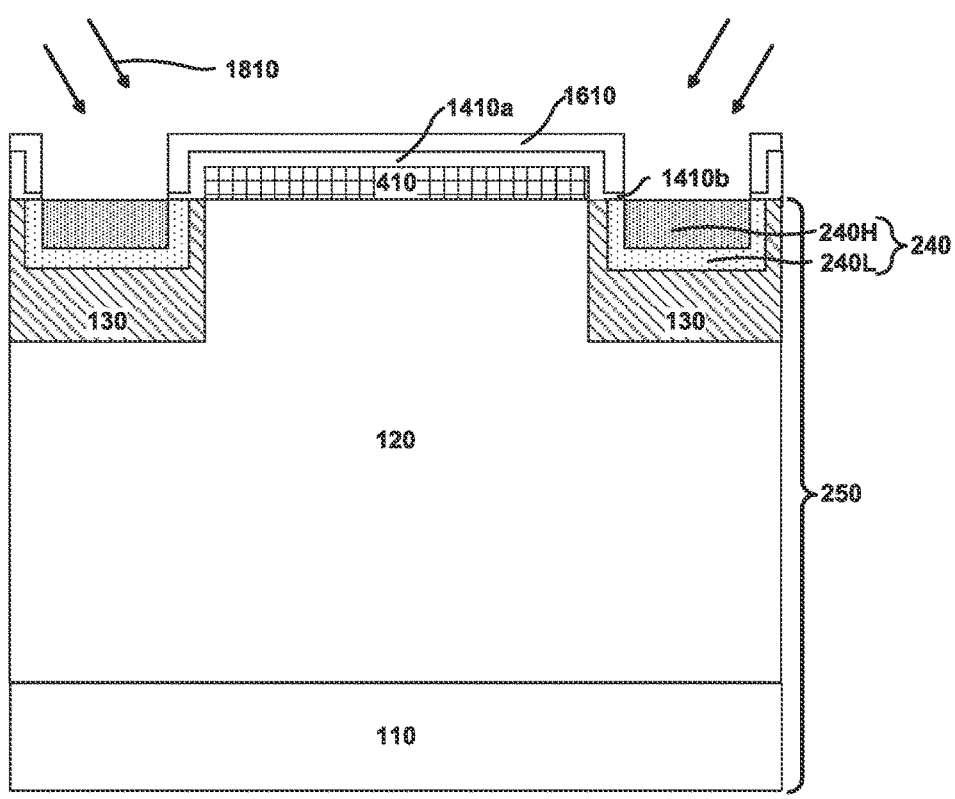

Referring to FIG. 18, an ion implantation operation 1810 may be performed. The ion implantation operation 1810 may implant n-type dopants into the low-concentration source/drain regions 240L to form the high-concentration source/drain regions 240H. In some embodiments, the ion implantation operation 1810 may be performed at a dose of $1\times10^{15}$ dopants/cm$^2$ to $5\times10^{15}$ dopants/cm$^2$, or higher, but the present invention is not limited thereto. In some embodiments, the ion implantation operation 1810 may be performed at a dose between $5\times10^{14}$ dopants/cm$^2$ to $5\times10^{16}$ dopants/cm$^2$. In some embodiments, the ion implantation operation 1810 may be performed at between 300° C. to 600° C. The high-concentration source/drain regions 240H and the low-concentration source/drain regions 240L may together form the source/drain region 240. The source/drain regions 240, the p-wells 130, the drift layer 120, and the substrate 110 may form the semiconductor layer structure 250.

Next, the hard mask 410, the first spacer layer 1410, including first portion 1410a and second portion 1410b, and the second spacer layer 1610 may be removed (e.g., via a lift-off process), and processing of the device may continue as described herein with respect to FIGS. 12 and 13.

The semiconductor device prepared according to the method described with respect to FIGS. 14 to 18 may have further reduced damage in the surface of the semiconductor layer structure 250 between the high-concentration source/drain regions 240H and the low-concentration source/drain regions 240L. Because the etching of the mask used to prepare the low-concentration source/drain regions 240L did not completely expose the surface of the semiconductor layer structure 250, damage due to the etching process may be reduced and/or avoided.

The present disclosure describes an approach that reduces and/or eliminates damage to portions of a source/drain region that may be below a gate electrode. By providing a high-concentration source/drain region within a low-concentration source/drain region, embodiments described herein may allow for the formation of a higher quality gate insulating layer between the gate electrode and the source region and/or between the gate electrode and the channel region. This may be particularly useful for improving the gate regions in a power transistor (e.g., a MOSFET, MISFET, or an IGBT).

While various ones of the embodiments discussed above illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of forming a semiconductor device, comprising:
   providing a drift layer on a substrate, the drift layer comprising a surface opposite the substrate;
   implanting ions into the drift layer to form a source/drain region in an upper portion of the drift layer that has a first portion that has a first dopant dose and a second portion in the first portion, the second portion having a second dopant dose, different from the first dopant dose;
   forming a gate dielectric layer on the drift layer; and
   forming a gate electrode on the gate dielectric layer, the gate electrode is entirely above the surface of the drift layer,
   wherein a portion of the gate dielectric layer has a bottom surface that is closer to the substrate than a top surface of the first portion of the source/drain region.

2. The method of claim 1, wherein the first dopant dose is between $1\times10^{12}$ dopants/cm$^2$ to $1\times10^{15}$ dopants/cm$^2$.

3. The method of claim 1, wherein the second dopant dose is between $5\times10^{14}$ dopants/cm$^2$ to $5\times10^{16}$ dopants/cm$^2$.

4. The method of claim 1, further comprising, prior to implanting ions into the drift layer to form the source/drain region, implanting ions into the drift layer to form a well region having a conductivity type opposite that of the source/drain region.

5. The method of claim 4, wherein implanting ions into the drift layer to form the well region is performed at a third dopant dose of between $1\times10^{12}$ dopants/cm$^2$ to $1\times10^{14}$ dopants/cm$^2$.

6. The method of claim 1, wherein a side boundary of the first portion of the source/drain region is laterally offset from a side boundary of the second portion of the source/drain region by a distance of between 50 Å to 2000 Å.

7. The method of claim 1, wherein an edge of the gate electrode is laterally separated from an interface between the first portion and the second portion of the source/drain region by 1000 Å to 5000 Å.

8. The method of claim 1, wherein a thickness of the gate dielectric layer over the first portion of the source/drain region is substantially uniform.

9. The method of claim 1, wherein forming the gate dielectric layer comprises thermally growing the gate dielectric layer.

10. The method of claim 1, wherein the gate dielectric layer comprises silicon dioxide.

11. The method of claim 1, wherein implanting ions into the drift layer to form the source/drain region comprises:
depositing a mask layer on the drift layer; and
patterning and etching the mask layer.

12. The method of claim 11, wherein patterning and etching the mask layer comprises leaving a first portion of the mask layer present on the drift layer, and
wherein implanting ions into the drift layer to form the source/drain region further comprises implanting ions through the first portion of the mask layer.

13. The method of claim 12, wherein the first portion of the mask layer has a thickness between 50 Å to 500 Å.

14. The method of claim 1, wherein the first portion of the source/drain region is underneath the gate electrode, and at least part of the second portion of the source/drain region is not underneath the gate electrode.

15. The method of claim 1, wherein at least part of the first portion of the source/drain region is underneath the gate electrode, and a bottom surface of the second portion of the source/drain region is closer to the substrate than a bottom surface of the first portion of the source/drain region.

16. A method of forming a semiconductor device, comprising:
providing a silicon carbide (SiC) drift layer on a substrate;
implanting second conductivity type dopant ions into the drift layer to form a well region;
implanting first conductivity type dopant ions into the well region to form a low-concentration source/drain region that has a first peak dopant concentration in an upper portion of the well region;
implanting first conductivity type dopant ions into less than all of an upper portion of the low-concentration source/drain region to convert a portion of the low-concentration source/drain region into a high-concentration source/drain region that has a second peak dopant concentration that exceeds the first peak dopant concentration, the low-concentration source/drain region and the high-concentration source/drain region together comprising a source/drain region;
forming a gate dielectric layer on the drift layer and the source/drain region; and
forming a gate electrode on the gate dielectric layer,
wherein a first portion of the high-concentration source/drain region extends underneath the gate dielectric layer.

17. The method of claim 16, wherein the second peak dopant concentration exceeds the first peak dopant concentration by at least an order of magnitude.

18. The method of claim 17, wherein a first portion of the low-concentration source/drain region that extends to a top surface of the source/drain region is underneath the gate electrode.

19. A method of forming a semiconductor device, comprising:
providing a silicon carbide (SiC) semiconductor layer structure comprising a source/drain region, a channel region, and a drift layer;
forming a gate dielectric layer on the SiC semiconductor layer structure; and
forming a gate electrode on the gate dielectric layer,
wherein a first portion of the gate dielectric layer that is in between the gate electrode and the source/drain region has a first thickness,
wherein a second portion of the gate dielectric layer that is in between the gate electrode and the channel region of the SiC semiconductor layer structure has a second thickness, and
wherein the first thickness is within 15% of the second thickness.

20. The method of claim 19, wherein a first concentration of semiconductor lattice damage induced defects in the first portion of the gate dielectric layer is within 10% of a second concentration of semiconductor lattice damage induced defects in the second portion of the gate dielectric layer.

21. The semiconductor device of claim 20, wherein the gate dielectric layer further comprises a third portion, different from the second portion, that is on the gate electrode and the source/drain region, and
wherein a third thickness of the third portion is greater than the first thickness of the first portion.

22. The semiconductor device of claim 21, wherein the source/drain region is a first source/drain region,
wherein the semiconductor layer structure further comprises a second source/drain region, with the drift layer extending in a first direction between the first and second source/drain regions, and
wherein a width of the first portion of the gate dielectric layer in the first direction is greater than a width of the third portion of the gate dielectric layer in the first direction.

23. The semiconductor device of claim 21, wherein a third concentration of semiconductor lattice damage induced defects in the third portion of the gate dielectric layer varies by greater than 10% from the second concentration of semiconductor lattice damage induced defects in the second portion of the gate dielectric layer.

24. The semiconductor device of claim 19, wherein the source/drain region comprises a high-concentration region comprising a first dopant concentration and a low-concentration region comprising a second dopant concentration, the first dopant concentration being higher than the second dopant concentration.

25. The semiconductor device of claim 24, wherein an edge of the gate electrode is laterally separated from an interface between the high-concentration region and the low-concentration region of the source/drain region by 5000 Å or less.

26. The semiconductor device of claim 24, wherein the first portion of the gate dielectric layer is on the low-concentration region of the source/drain region.

* * * * *

UNITED STATES PATENT AND TRADEMARK OFFICE
CERTIFICATE OF CORRECTION

PATENT NO. : 11,721,755 B2
APPLICATION NO. : 17/669409
DATED : August 8, 2023
INVENTOR(S) : Steinmann et al.

It is certified that error appears in the above-identified patent and that said Letters Patent is hereby corrected as shown below:

In the Specification

Column 12, Line 7: Please correct "2401" to read --240I--

Column 12, Line 13: Please correct "2401" to read --240I--

Column 12, Line 15: Please correct "2401" to read --240I--

Column 12, Line 24: Please correct "2401" to read --240I--

Column 12, Line 28: Please correct "2401" to read --240I--

Column 12, Line 32: Please correct "2401" to read --240I--

Column 12, Line 36: Please correct "2401" to read --240I--

Column 13, Line 67: Please correct "(n)" to read --(n$^-$)--

Signed and Sealed this
Twenty-sixth Day of September, 2023

Katherine Kelly Vidal
*Director of the United States Patent and Trademark Office*